United States Patent
Zou et al.

(10) Patent No.: US 8,812,922 B2
(45) Date of Patent: Aug. 19, 2014

(54) SPEEDING UP DEFECT DIAGNOSIS TECHNIQUES

(75) Inventors: Wei Zou, Portland, OR (US); Huaxing Tang, Wilsonville, OR (US); Wu-Tung Cheng, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 11/688,782

(22) Filed: Mar. 20, 2007

(65) Prior Publication Data

US 2007/0226570 A1    Sep. 27, 2007

Related U.S. Application Data

(60) Provisional application No. 60/784,308, filed on Mar. 20, 2006, provisional application No. 60/850,148, filed on Oct. 5, 2006, provisional application No. 60/891,711, filed on Feb. 26, 2007.

(51) Int. Cl.
*G01R 31/28* (2006.01)
*G06F 11/00* (2006.01)
*G06F 11/22* (2006.01)
*G06F 11/26* (2006.01)

(52) U.S. Cl.
CPC .......... *G06F 11/2252* (2013.01); *G06F 11/261* (2013.01)
USPC .......................................... 714/737; 714/741

(58) Field of Classification Search
CPC ............................ G06F 11/2252; G06F 11/261
USPC ................................................. 714/741, 737
See application file for complete search history.

(56) References Cited

U.S. PATENT DOCUMENTS

| 4,228,537 | A | | 10/1980 | Henckels et al. | |
|---|---|---|---|---|---|
| 4,242,751 | A | * | 12/1980 | Henckels et al. | 714/737 |
| 5,515,384 | A | * | 5/1996 | Horton, III | 714/732 |
| 5,570,376 | A | * | 10/1996 | Kunda et al. | 714/736 |

(Continued)

FOREIGN PATENT DOCUMENTS

WO    WO 2007/109322    9/2007

OTHER PUBLICATIONS

Schulz, M.H.; Trischler, E.; Sarfert, T.M., "SOCRATES: a highly efficient automatic test pattern generation system," Computer-Aided Design of Integrated Circuits and Systems, IEEE Transactions on, vol. 7, No. 1, pp. 126,137, Jan. 1988.*

(Continued)

*Primary Examiner* — Steve Nguyen
(74) *Attorney, Agent, or Firm* — Klarquist Sparkman, LLP

(57)    ABSTRACT

Fault diagnosis techniques (e.g., effect-cause diagnosis techniques) can be speeded up by, for example, using a relatively small dictionary. Examples described herein exhibit a speed up of effect-cause diagnosis by up to about 160 times. The technologies can be used to diagnose defects using compacted fail data produced by test response compactors. A dictionary of small size can be used to reduce the size of a fault candidate list and also to facilitate procedures to select a subset of passing patterns for simulation. Critical path tracing can be used to handle failing patterns with a larger number of failing bits, and a pre-computed small dictionary can be used to quickly find the initial candidates for failing patterns with a smaller number of failing bits. Also described herein are exemplary techniques for selecting passing patterns for fault simulation to identify faults in an electronic circuit.

48 Claims, 34 Drawing Sheets

(56) References Cited

U.S. PATENT DOCUMENTS

| | | | |
|---|---|---|---|
| 5,640,403 A * | 6/1997 | Ishiyama et al. | 714/737 |
| 5,663,967 A * | 9/1997 | Lindberg et al. | 714/737 |
| 5,726,996 A * | 3/1998 | Chakradhar et al. | 714/724 |
| 5,799,022 A | 8/1998 | Williams | |
| 6,708,306 B2 * | 3/2004 | Bartenstein et al. | 714/741 |
| 7,219,287 B1 * | 5/2007 | Toutounchi et al. | 714/738 |
| 2006/0066338 A1 | 3/2006 | Rajski et al. | |
| 2006/0069972 A1 * | 3/2006 | Guettaf | 714/726 |

OTHER PUBLICATIONS

Abramovici et al., "Fault Diagnosis Based on Effect-Cause Analysis: An Introduction," *Proc. DAC*, pp. 69-76, 1980.

Amyeen et al., "Improving Precision Using Mixed-Level Fault Diagnosis," *International Test Conference*, paper 22.3, Oct. 2006.

Appello et al., "Yield Analysis of Logic Circuits," *Proc. of VTS*, pp. 103-108, 2004.

Bartenstein et al., "Diagnosing Combinational Logic Designs Using the Single Location At-a-Time (SLAT) Paradigm," *International Test Conference*, pp. 287-296, 2001.

Bartenstein et al., "Integrating Logical and Physical Analysis Capabilities for Diagnostics," *Proc. of ISTFA*, pp. 521-526, 2004.

Bodoh et al., "Diagnostic Fault Simulation for the Failure Analyst," *Proc. of ISTFA*, pp. 181-190, 2004.

Boppana et al., "Full Fault Dictionary Storage Based on Labeled Tree Encoding," *Proc. VTS / 14th VLSI Test Symposium*, pp. 174-179, 1996.

Cheng et al., "Compactor Independent Direct Diagnosis," *Proc. ATS*, pp. 204-209, 2004.

Chess et al., "Creating Small Fault Dictionaries," *IEEE Transactions on Computer-Aided Design of Integrated Circuits and Systems*, vol. 18, No. 3, pp. 346-356, 1999.

Erb et al., "Yield Enhancement Through Fast Statistical Scan Test Analysis for Digital Logic," *Proc. of Adv. Semi. Manuf. Conf. and Workshop*, pp. 250-255, Apr. 11-12, 2005.

Hora et al., "An Effective Diagnosis Method to Support Yield Improvement," *International Test Conference*, pp. 260-269, 2002.

Keim et al., "A Rapid Yield Learning Flow Based on Production Integrated Layout-Aware Diagnosis," *International Test Conference*, paper 7.1, Oct. 2006.

Kruseman et al., "Systematic Defects in Deep Sub-Micron Technologies," *International Test Conference*, pp. 290-299, 2004.

Lavo et al., "Making Cause-Effect Cost Effective: Low-Resolution Fault Dictionaries," *International Test Conference*, pp. 278-286, 2001.

Lavo et al., "Multiplets, Models, and the Search for Meaning: Improving Per-Test Fault Diagnosis," *International Test Conference*, pp. 250-259, 2002.

Leininger et al., "Compression Mode Diagnosis Enables High Volume Monitoring Diagnosis Flow," *of International Test Conference*, paper 7.3, Nov. 8-10, 2005.

Lin et al., "Test Generation for Designs With Multiple Clocks," *IEEE Design Automation Conference*, pp. 662-667, 2003.

Mrugalski et al., "Fault Diagnosis in Designs With Convolutional Compactor," *International Test Conference*, pp. 498-507, 2004.

Pomeranz et al., "On the Generation of Small Dictionaries for Fault Location", *Proc. International Conference on Computer-Aided Design*, pp. 272-279, 1992.

Rajski et al., "Embedded Deterministic Test," *IEEE TCAD*, vol. 23, No. 5, pp. 776-792, May 2004.

Ryan et al., "Two-Stage Fault Locations," *International Test Conference*, pp. 963-968, 1991.

Schuermyer et al., "Identification of Systematic Yield Limiters in Complex ASICS Through Volume Structural Test Fail Data Visualization and Analysis," *International Test Conference*, paper 7.1, Nov. 8-10, 2005.

Seshadri et al., "Dominance Based Analysis for Large Volume Production Fail Diagnosis," *Proc. of VTS*, pp. 392-399, Apr. 30-May 4, 2006.

Stanojevic et al., "Enabling Yield Analysis with X-Compact," *International Test Conference*, pp. 1085-1092, Nov. 8-10, 2005.

Tang et al., "Analyzing Volume Diagnosis Results With Statistical Learning for Yield Improvement," *Proc. of ETS*, pp. 145-150, May 20-24, 2007.

Tang et al., "Improving Diagnosis Performance with Minimal Memory Overhead," *16th Asia Test Symposium*, pp. 281-287, Oct. 8-11, 2007.

Venkatarman S. and S. Drummonds, "POIROT: A Logic Fault Diagnosis Tool and Its Application," *International Test Conference*, pp. 253-262, 2000.

Waicukausk et al., "Failure Diagnosis of Structured VLSI," *IEEE Design and Test of Computers*, vol. 6, No. 4, pp. 49-60, 1989.

Wang et al., "An Efficient and Effective Methodology on the Multiple Fault Diagnosis," *International Test Conference*, pp. 329-338, 2003.

Wang et al., "Analysis and Methodology for Multiple-Fault Diagnosis," *IEEE Transactions on Computer-Aided Design of Integrated Circuits and Systems*, vol. 25, No. 3, pp. 558-575, Mar. 2006.

Zou et al., "Bridge Defect Diagnosis With Physical Information," *Proc. of ATS*, pp. 248-253, Dec. 18-21, 2005.

Zou et al., "On Methods to Improve Location Based Logic Diagnosis," *VLSI Design*, pp. 181-187, Jan. 3-7, 2006.

Zou et al. "Speeding up Effect-Cause Defect Diagnosis using a Small Dictionary," *Proc. of VTS*, pp. 225-230, May 6-10, 2007.

International Search Report and Written Opinion of the International Searching Authority, dated Sep. 10, 2008, for International Patent Application No. PCT/US07/07021 (corresponding to WO 2007/109322), 8 pages.

\* cited by examiner

```
An example of a test pattern
pattern = 1;
    apply "grp1_load" 0 =
        chain "chain1" = "0100001010";
        chain "chain2" = "0101111100";
    end;
    force    "PI" "10100" 1;
    measure "PO" "01001" 2;
    apply "clk3" 1 3;
    apply "grp1_unload" 4 =
        chain "chain1" = "0000001111";
        chain "chain2" = "0011111111";
    end;
  procedure clock "clk3" =
        force "/clk_in" 0 0;
        force "/clk_tn" 0 0;
        force "/xclk_in" 1 1450;
        force "/xclk_in" 0 1550;
        period 2000;
    end;
```

FIG. 6

SPEEDING UP DEFECT DIAGNOSIS TECHNIQUES

CROSS REFERENCE TO RELATED APPLICATIONS

This application claims the benefit of U.S. Provisional Patent Application No. 60/784,308, filed Mar. 20, 2006, titled "PASSING PATTERN SELECTION TECHNIQUES FOR IMPROVING DEFECT DIAGNOSIS," U.S. Provisional Patent Application No. 60/850,148, filed Oct. 5, 2006, titled "SPEEDING UP EFFECT-CAUSE DEFECT DIAGNOSIS TECHNIQUES USING A SMALL DICTIONARY," and U.S. Provisional Patent Application No. 60/891,711, filed Feb. 26, 2007, titled "SPEEDING UP EFFECT-CAUSE DEFECT DIAGNOSIS TECHNIQUES USING A SMALL DICTIONARY," all of which are incorporated herein by reference.

FIELD

The technologies disclosed herein relate to diagnosing defects in electronic circuits.

BACKGROUND

In semiconductor manufacturing, defect diagnosis methods can be used to improve yield. A diagnosis method desirably has high diagnosis accuracy, high diagnosis resolution, and a short run time. Generally speaking, defect diagnosis methods can be classified into two main categories: cause-effect diagnosis and effect-cause diagnosis. Cause-effect diagnosis techniques (also called dictionary-based diagnosis techniques) typically pre-compute and store faulty responses of modeled faults in a dictionary. In the process of the diagnosis, the observed failure responses are compared with the pre-computed failure responses in the dictionary. The faults whose pre-computed failure responses have a close or closest match with the observed failure responses are chosen as final candidates. Because dictionary-based diagnosis techniques do not perform any fault simulation during the diagnosis, their diagnosis speed is typically fast. However, existing dictionary-based diagnosis approaches typically require a large amount of memory to store the pre-computed failures responses. For large designs, the large memory requirement can make such known dictionary-based diagnosis techniques impractical.

On the other hand, effect-cause diagnosis techniques do not initially simulate all the modeled faults. Instead, conventional effect-cause diagnosis techniques first identify fault candidates from the failing test pattern(s) using a back tracing procedure and subsequently perform simulations with the fault candidates. In general, effect-cause defect diagnosis comprises two phases. In the first phase, initial defect candidates are derived from the failed test patterns (and in particular from the failing test responses associated with the failed test patterns). In the second phase, one or more passing patterns are used to eliminate the "fake" defect candidates or rank the defect candidates according to the simulation mismatches of passing patterns. Compared to cause-effect diagnosis, effect-cause diagnosis techniques do not use a large amount of memory to store pre-computed faulty signatures and can also provide high diagnosis accuracy and diagnosis resolution. In many cases, however, a large number of passing patterns are simulated during the second phase of effect-cause diagnosis, which can slow the diagnosis.

SUMMARY

The technologies disclosed herein can be used to speed up effect-cause diagnosis by, for example, using a relatively small dictionary. Compared to traditional fault dictionaries, the embodiments of dictionaries disclosed herein have a smaller size, but can speed up effect-cause diagnosis while generally maintaining diagnosis accuracy. Examples described below exhibit a speed up of effect-cause diagnosis by up to about 160 times. Moreover, the technologies can be used to diagnose defects using compacted fail data produced by test response compactors. In examples disclosed herein, a dictionary of small size can be used to reduce the size of a fault candidate list and also to facilitate procedures to select a subset of passing patterns for simulation.

Electronic circuit faults diagnosed using one or more technologies described herein can include, for example, stuck-at faults, transition faults, bridging faults, and other faults.

Described herein are exemplary diagnosis techniques which can combine effect-cause diagnosis and cause-effect diagnosis. For example, critical path tracing can be used to effectively handle failing patterns with many failing bits, and a pre-computed small dictionary can be used to quickly find the initial candidates for failing patterns with a small number of failing bits.

Also described herein are exemplary techniques for selecting passing patterns to use in fault simulation to identify faults in an electronic circuit.

In some embodiments, a method of diagnosing defects in an electronic circuit comprises: determining a set of one or more fault candidates for the electronic circuit for a set of failing test patterns by using a fault dictionary that describes responses of one or more modeled faults to the failing test patterns; simulating one or more fault candidates of the determined set using passing test patterns, failing test patterns, or both failing and passing test patterns; and storing the one or more fault candidates and results of the simulating one or more fault candidates on one or more computer-readable media. The method can further comprise ranking the one or more fault candidates based at least in part on results of the simulation and storing the results of the ranking on one or more computer-readable media. In further embodiments, the fault dictionary comprises one or more entries identifying one or more fault candidates and identifying one or more clocks that are associated with scan cells that capture failing bits caused by the one or more fault candidates. In some embodiments the fault dictionary comprises information associating one or more circuit clock signals with the one or more fault candidates. In further embodiments the fault dictionary comprises one or more entries indicating possible signatures produced by one or more of the failing test patterns.

In further embodiments, a method of diagnosing one or more defects in an electronic circuit comprises: determining a portion of a first list of candidate faults for one or more failing test patterns applied to the electronic circuit, the determination being made using a description of one or more modeled faults and circuit responses produced by the one or more modeled faults; performing fault simulation of at least some of the candidate faults of the first list to determine a second list of candidate faults; and storing at least one of the first or second lists in one or more computer-readable media. In some embodiments, the portion of the first list is a first portion of the first list, and the method further comprises determining a second portion of the first list of candidate faults using critical path tracing. In further embodiments, the responses produced by the one or more modeled faults are signatures produced by compression hardware, and the method further comprises generating the description by simulating the one or more modeled faults and determining the signatures produced by the one or more modeled faults when the one or more failing test patterns are applied.

In some embodiments, a method of diagnosing defects in an electronic circuit comprising two or more clocks comprises: selecting one or more passing test patterns for simulation with one or more fault candidates of the electronic circuit, wherein the passing test patterns are selected based at least in part on associations of the one or more passing test patterns with one or more clocks associated with the one or more fault candidates; and storing the selection in one or more computer-readable media. The method can further comprise determining the associations of the patterns with one or more clocks based at least in part on a netlist description of the circuit. In some embodiments, the associations indicate which of the two or more clocks clock scan cells that capture failing bits caused by the one or more fault candidates. An association of a respective one of the two or more clocks with the one or more fault candidates can be indicated by a single bit.

In further embodiments, a method of generating a fault dictionary for use in diagnosing faults in an electronic circuit comprises, for a selected fault, simulating one or more test patterns being applied to the electronic circuit in the presence of the selected fault; determining test responses to the one or more test patterns that indicate the presence of the selected fault using the simulation; and storing, in one or more computer-readable media, a fault dictionary entry that identifies the selected fault and identifies the test responses that indicate the presence of the selected fault. In some embodiments the fault dictionary entry is the only entry in the dictionary for the selected fault. In additional embodiments, the fault dictionary entry does not indicate which of the one or more test patterns caused the test responses that indicate the presence of the selected fault to be produced. The method can further comprise repeating the acts of simulating, determining, and storing for multiple additional faults. In some embodiments the act of determining the test responses comprises generating x-bit signatures from full test responses of the electronic circuit to the one or more test patterns. The act of storing the fault dictionary entry can comprise storing the corresponding x-bit signatures as the test responses that indicate the presence of the selected fault. The x-bit signatures can be generated by a simulated multiple-input signature register (MISR). The method can further comprise storing information indicative of which clocks clocked scan cells that captured failing bits indicative of the presence of the selected fault during the simulation.

In some embodiments, a method of generating a fault dictionary for use in diagnosing faults in an electronic circuit comprises: determining, for a selected fault, that a first test pattern and a second test pattern detect the selected fault and produce a same respective signature; and storing in one or more computer-readable media one fault dictionary entry for the first and second failing test patterns. The approximate size of the fault dictionary can correspond to a size of a signature, a number of faults in the electronic circuit detectable by the one or more failing test patterns, an average number of unique signatures for faults, and a number of clocks in the electronic circuit. In further embodiments the act of determining comprises compacting test results from the first test pattern and the second test pattern. In additional embodiments the act of determining comprises compacting test results of the one or more failing test patterns in a simulated multiple-input shift register. Further embodiments comprise a method of diagnosing one or more defects in an electronic circuit design using a fault dictionary made according to embodiments of this method.

In some embodiments a method of generating a fault dictionary for diagnosing faults in an electronic circuit comprises: simulating one or more faults in a representation of the electronic circuit as one or more test patterns are applied to the representation; selecting one or more failing test patterns from the simulation results; identifying one or more unique failing bit combinations for the selected failing patterns; creating one or more signatures from the one or more unique failing bit combinations; and storing the one or more signatures in one or more computer-readable media. In particular embodiments the act of selecting the one or more failing test patterns comprises selecting failing test patterns whose simulated results produce fewer than a threshold number of failing bits. The method can be part of a preprocessing phase of an electronic circuit testing method. In some embodiments the storing the one or more signatures comprises associating a given signature with a group of two or more faults, and in further embodiments the group of two or more faults is located in a fan-out free region.

In further embodiments, a method of diagnosing one or more faults in an electronic circuit comprises: determining if a failing test pattern applied to the circuit comprises more than a threshold number of failing bits, wherein the threshold number is greater than one; if the pattern does not comprise more than the threshold number of failing bits: determining a signature for the failing test pattern; determining one or more fault candidates associated with the signature using a dictionary; and storing one or more of the fault candidates in one or more computer-readable media. In some embodiments the method further comprises, if the pattern comprises more than the threshold number of failing bits: performing path tracing to determine one or more fault candidates; and storing one or more of the fault candidates in one or more computer-readable media. In additional embodiments, the method further comprises performing fault simulation for one or more of the fault candidates; and storing results of the fault simulation in one or more computer-readable media. In some embodiments, wherein determining one or more fault candidates comprises determining two or more fault candidates, the determining two or more fault candidates comprises: querying the dictionary with the signature; receiving query results indicative of two or more fault candidates associated with the signature; and determining the two or more fault candidates from the query results. In further embodiments, one or more computer-readable media comprise a fault dictionary made according to one or more embodiments of this method. In additional embodiments, one or more computer-readable media comprise instructions configured to cause a computer to perform one or more embodiments of this method.

Any of the disclosed methods may be performed by a computer program, such as an electronic-design-automation (EDA) software tool comprising computer-executable instructions stored on one or more computer-readable media. All such media are considered to be within the scope of this disclosure. Any of the disclosed methods implemented in a computer environment can also be performed by a single computer or via a network. Any of the disclosed methods can be used to generate and store one or more data structures or databases having intermediate or final results of the diagnostic procedures disclosed herein (e.g., a list of fault candidates, rankings, and the like). All such data structures and databases (stored, for example, on one or more computer-readable media) are considered to be within the scope of this disclosure. The disclosed methods can also be used at least in part to modify or design a circuit represented as circuit design information stored on a computer-readable medium. The circuit design information can comprise, for example, a circuit design file (such as a GDSII or Oasis file). All such types of circuit design information representing circuits modified to cure defects identified at least in part using any of the disclosed embodiments considered to be within the scope of this disclosure. Similarly, all resulting circuits from such modified circuit design information are similarly considered to be within the scope of this disclosure. Furthermore, any of the disclosed fault dictionaries (either in a completed form or as a partial dictionary generated during any stage of a dictionary creation process) can be stored on one or more computer-readable media. All such media are also considered to be within the scope of this disclosure.

The foregoing and other objects, features, and advantages of the disclosed technologies will become more apparent from the following detailed description, which proceeds with reference to the accompanying figures.

BRIEF DESCRIPTION OF THE DRAWINGS

FIG. 6 shows an example of a test pattern.

DETAILED DESCRIPTION

General Considerations

Figure 1:
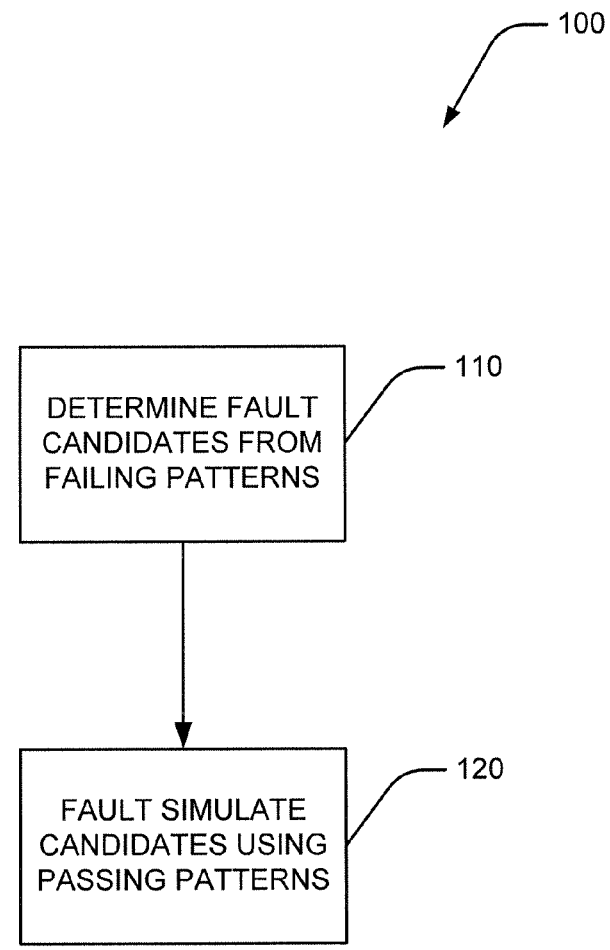
FIG. 1 is a block diagram of an exemplary embodiment of a prior art method of effect-cause diagnosis.

Disclosed below are representative embodiments of methods, apparatus, and systems having particular applicability to testing, diagnosing, and improving the yield and quality of integrated circuits that should not be construed as limiting in any way. Instead, the present disclosure is directed toward all novel and nonobvious features and aspects of the various disclosed methods, apparatus, and systems, and their equivalents, alone and in various combinations and subcombinations with one another. The disclosed technology is not limited to any specific aspect or feature, or combination thereof, nor do the disclosed methods, apparatus, and systems require that any one or more specific advantages be present or problems be solved.

Moreover, any of the methods, apparatus, and systems described herein can be used in conjunction with the manufacture and testing of a wide variety of integrated circuits (e.g., application-specific integrated circuits (ASICs), programmable logic devices (PLDs) such as a field-programmable gate arrays (FPGAs), or systems-on-a-chip (SoCs)), which utilize a wide variety of components (e.g., digital, analog, or mixed-signal components). Circuits having defects that are detected using the disclosed techniques can in some circumstances be repaired.

Although the operations of some of the disclosed methods are described in a particular, sequential order for convenient presentation, it should be understood that this manner of description encompasses rearrangement, unless a particular ordering is required by specific language set forth below. For example, operations described sequentially can be rearranged or performed concurrently. Moreover, for the sake of simplicity, the figures herein may not show the various ways in which the disclosed methods, apparatus, and systems can be used in conjunction with other methods, apparatus, and systems. Additionally, the description sometimes uses terms like "determine" and "identify" to describe the disclosed technology. These terms are high-level abstractions of the actual operations that are performed. The actual operations that correspond to these terms will vary depending on the particular implementation and are readily discernible by one of ordinary skill in the art.

The disclosed embodiments can be implemented in a wide variety of environments. For example, any of the disclosed techniques can be implemented in whole or in part as software comprising computer-executable instructions stored on one or more computer-readable media (e.g., computer-readable media, such as one or more CDs, volatile memory components (such as DRAM or SRAM), or nonvolatile memory components (such as hard drives)). Such software can comprise, for example, electronic design automation (EDA) software tools (e.g., a failure diagnosis tool). The particular software tools described should not be construed as limiting in any way, however, as the principles disclosed herein are generally applicable to other software tools.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail. Any of the disclosed methods can alternatively be implemented (partially or completely) in hardware (e.g., an ASIC, PLD, or SoC).

Further, data produced from any of the disclosed methods can be created, updated, or stored on one or more computer-readable media (e.g., computer-readable media, such as one or more CDs, volatile memory components (such as DRAM or SRAM), or nonvolatile memory components (such as hard drives)) using a variety of different data structures or formats. For example, fault dictionaries generated according to embodiments of the disclosed technologies can be stored on one or more computer-readable media. Such data can be created or updated at a local computer or over a network (e.g., by a server computer).

Moreover, any of the disclosed methods can be used in a computer simulation, ATPG, or other EDA environment, wherein test patterns, test responses, and compressed test responses are determined by or otherwise analyzed using representations of circuits, which are stored on one or more computer-readable media. For presentation purposes, however, the present disclosure sometimes refers to a circuit or its circuit components by their physical counterpart (for example, scan cells, spatial compactors, registers, selection logic, logic gates, and other such terms). It should be understood, however, that any reference in the disclosure or the claims to a physical component includes representations of such circuit components as are used in simulation, ATPG, or other such EDA environments.

TERMINOLOGY

Below are exemplary definitions of some terms used in describing the disclosed technologies.

A "faillog" generally refers to the failure information for a given failing die or circuit-under-test. Although a die may fail different tests, such as an $I_{ddq}$ test, memory test, chain test and/or scan test, in exemplary embodiments only scan test failures are noted in the faillog. In exemplary embodiments, failure information can be stored in a pattern-based format.

A "failing pattern" generally refers to a test pattern which causes the die or circuit under test to fail during testing. In some contexts, the term failing pattern refers to the failing test response produced upon application of the failing test pattern. A "passing pattern" generally refers to a test pattern which does not cause the die or circuit under test to fail during testing. In some contexts, the term passing pattern refers to the passing test response produced upon application of the passing test pattern. A faillog can indicate one or more failing patterns.

A "failing bit" generally refers to an observing bit for a die or circuit where a discrepancy is observed (e.g., by a tester) between the actual value and an expected value. A "passing" bit is an observing bit for a die or circuit where a discrepancy between the actual value and an expected value is not observed. A failing pattern may contain one or more failing bits.

A "suspect" generally refers to a diagnosis result or callout explaining part of a faillog. Failing patterns which can be explained by a suspect are called "failing pattern matches" for this suspect. Failing patterns which cannot be explained by a suspect are called "failing pattern mismatches" for this suspect. Passing patterns which can be explained by a suspect are called "passing pattern matches" for this suspect. Passing patterns which can not be explained by a suspect are called passing pattern "mismatches" for this suspect. The passing patterns can be used to compute a score for one or more suspects.

A "symptom" generally refers to a group of suspects which can explain at least some failure information and which tend to be associated with the same physical defect. Because more than one defect may occur in a single die, diagnosis results can report more than one symptom for each faillog. For each symptom, more than one suspect may be identified because of the limitations of diagnosis. For each suspect, the defect type can be taken into account when determining the passing pattern matches or mismatches.

Introduction to the Disclosed Technologies

As manufacturers go into volume production of 90 nm designs and below, the defect type has generally changed from the random particle defect to the design-specific systematic defect. In order to identify the design-specific systematic defect, a large number of failed dies typically need to be diagnosed in a short time. Therefore, defect diagnosis (one or more processes performed to detect and desirably isolate the defect from the failed dies using failure information collected from a tester) can play a role in the initial yield ramp.

As mentioned above, existing dictionary-based diagnosis approaches (e.g., cause-effect diagnosis) typically require a large amount of memory to store pre-computed failure responses. For a large industry design, the large memory requirement can make such known dictionary-based diagnosis impractical. To reduce the memory size, methods can sometimes be used to compress the dictionary or store only partial information of a complete dictionary. For example, a so-called pass-fail dictionary or a drop-on-k dictionary can be used. Although a reduced dictionary of this type can save the memory usage to some extent, it can still use a large amount of memory for a large industry design with several million gates. Moreover, reduced dictionaries using these approaches can result in lost diagnostic accuracy and resolution due to incomplete information.

In at least some situations, there can be another issue associated with the cause-effect diagnosis. Since the fault dictionary is pre-computed for a given design and a set of patterns, cause-effect diagnosis has less flexibility than effect-cause diagnosis. When the design or the pattern set is changed, the fault dictionary must typically be updated. For different fault models, different fault dictionaries need to be created. Generally, any information needed for a diagnosis algorithm must be stored in the fault dictionary, which can make the dictionary larger.

By contrast, without initially simulating all modeled faults, effect-cause diagnosis techniques typically simulate potential fault candidates obtained from a back tracing procedure. In general, effect-cause defect diagnosis can be viewed as comprising two phases, as explained below. Compared to cause-effect diagnosis, effect-cause diagnosis techniques do not use a large amount of memory to store pre-computed faulty signatures and can also provide high diagnosis accuracy and diagnosis resolution. Consequently, effect-cause diagnosis techniques are used widely in commercial diagnosis tools. In many cases, however, a large number of passing patterns are simulated during the second phase of effect-cause diagnosis. A large number of passing pattern simulations, however, can slow effect-cause diagnosis, sometimes significantly.

FIG. 1 shows a block diagram of an exemplary embodiment of an effect-cause diagnosis method 100. In method act 110 (the "first phase" of method 100), a set of fault candidates in an electronic circuit can be determined from a group of failing test patterns that have been applied to the circuit. In method act 120 (the "second phase" of method 100), fault candidates can be ranked by fault simulating the candidates using one or more passing patterns.

Figure 2:
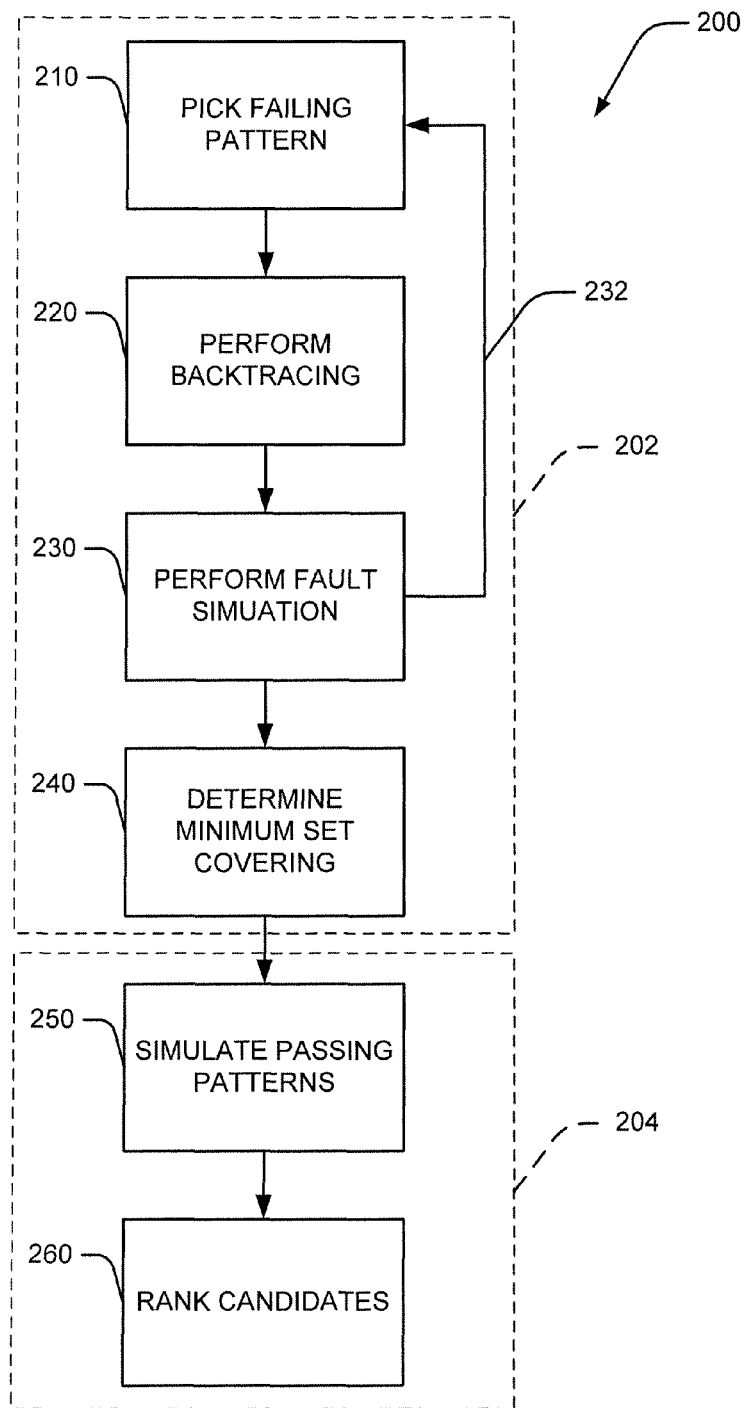
FIG. 2 is a block diagram of an exemplary embodiment of a prior art method of effect-cause diagnosis.

FIG. 2 shows a block diagram of another exemplary embodiment of an effect-cause diagnosis method 200 for diagnosing faults in an electronic circuit. In this depicted embodiment, a first phase 202 comprises a method act 210, in which a pattern p can be selected from a group of failing test patterns G. In method act 220, back tracing can be performed from the scan cell or primary output that captured failing bits to find a subset Q of a set of faults which can potentially explain the pattern p. In method act 230 the faults in Q for the failing pattern p can be simulated to find a subset Q' of Q which can actually explain the failing bits associated with the failing test pattern p. In at least some embodiments, a failing pattern p is said to be explained by a fault f if the circuit outputs resulting from the injection of fault f are the same as the test response bits (outputs) observed on the tester when the pattern p is applied. A plurality (e.g., all) of the failing patterns in G can be analyzed (as indicated by the arrow 232). In some embodiments and in method act 240, a minimum set covering algorithm is used to find a subset S (e.g., having the minimum size possible) of the set of faults which can explain all the failing patterns. The faults in S can be considered the final defect candidates. In the method 200, a second phase 204 can comprise a method act 250, in which the fault candidates in S can be simulated over most or all the passing patterns to find a number of passing pattern mismatches for each candidate. The number of passing mismatches combined with other information (such as failing pattern matches) can be used to calculate a score for each candidate. In method act 260, the defect candidates can be ranked according to their scores (e.g., in descending or ascending order). In some embodiments, the results of one or more method acts of method 200 can be stored in one or more computer-readable media.

One or more of the method acts of method 200 can be run-time intensive. For example, the back tracing in method act 220 can require considerable resources, as can fault simulation in method act 230 of the first phase for faults in Q using failing patterns to obtain the faults in Q'. In some embodiments, this high resource usage can be due to the fact that the size of Q is often large. Additionally, back tracing procedures often use a version of critical path tracing, and in some cases the faults identified through such procedures trigger a large number of events during fault simulation. In this context, an "event" refers to a gate in the circuit design which needs to be evaluated due to a change to one or more of its input values during fault simulation. An additional time-intensive step can be the run time for the second phase for simulating faults in S using all passing patterns. Although the number of faults in S is typically small, the number of passing patterns is typically large.

Figure 3:
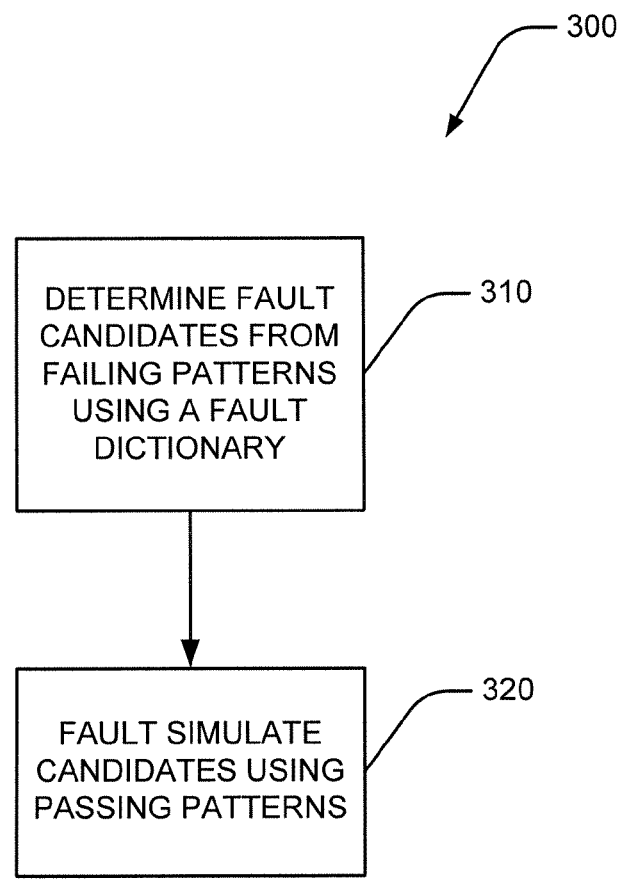
FIG. 3 is a block diagram of an exemplary embodiment of a method of diagnosing faults in an electronic circuit.

Exemplary Embodiments of Diagnosis Methods Using a Small Dictionary and/or Selected Passing Patterns FIG. 3 is a block diagram of one embodiment of an exemplary method 300 for diagnosing faults in an electronic circuit. The method 300 comprises a method act 310, in which fault candidates are determined using one or more "small" dictionaries, as further explained below. In a method act 320, fault candidates can be fault simulated using passing patterns (e.g., a subset selected from all passing patterns) as explained below. Fault simulation results can comprise, for example, a set of faults that can explain a failing pattern and respective rankings for the faults.

Exemplary Structure of a Small Size Fault Dictionary

Before explaining how a dictionary can be used in method 300, a discussion of exemplary dictionary structures is provided. The term "dictionary," as used with one or more technologies described herein, generally refers to one or more collections or arrangements of data that are usable by a computer system. The dictionary may be, for example, a data structure or combination of data structures (such as a queue, stack, array, linked list, heap, or tree) that organizes data for better processing efficiency, or any other structured logical or physical representation of data in a computer system or computer-readable media (such as a table used in a relational database or a dataset).

A "fault dictionary" can indicate at least some errors that the modeled faults in the circuit are expected to cause. A "complete dictionary" is a full-response fault dictionary, which stores the values of all circuit outputs in the presence of each fault for each test. The number of bits required to store a complete dictionary is typically F*V*O, where F is the number of faults, V is the number of test patterns, and O is the number of outputs. For a large industrial design with several million gates, it is often impractical to use a complete dictionary due to its large dictionary size. To reduce the dictionary size, in some embodiments a "pass-fail dictionary" stores only one bit of information (pass or fail) for each fault per test pattern. Accordingly, the number of bits required for a pass-fail dictionary is typically F*V. Because information about the identity of the failing outputs is usually omitted in a pass-fail dictionary, it generally leads to lower diagnosis accuracy.

In certain embodiments of the disclosed technology, an exemplary small size dictionary is created (in a preprocessing step, for example) and used during diagnosis of a failing product. One example of a small dictionary used to speed up effect-cause diagnosis has information that enables the accurate determination of initial candidates for each failing pattern, as well as a small memory size. Here, accuracy implies that most or all candidates that can actually explain a failing pattern are included in the initial candidate set. To help satisfy these two properties, one approach is to utilize a small dictionary based on signatures.

For example, in some embodiments, given a circuit fault and test pattern that detects the fault, an x-bit signature (e.g., a 32-bit signature) can be computed using a compactor (or compactor simulation) into which the errors in the circuit outputs are fed. In some embodiments, a multiple-input shift register (MISR) (or MISR simulation) is used to produce at least some of the signatures, but some embodiments use other compactors or circuits for generating a signature. In such embodiments, the number of bits M required to store such a dictionary for F faults can be calculated as:

$$M = x*F \quad (1)$$

In some embodiments, only unique signatures are stored for one or more faults. That is, if two or more different failing patterns produce the same signature for a given fault, only one signature is stored. According to such embodiments, the unique signatures of a fault f under a test set T can be the union of the signatures of f for test patterns of T. For example, for a fault f and a test set T={T1, T2, T3, T4}, if the signatures of f for the test patterns T1, T2, T3 and T4 are A, B, A, and B, respectively, then the unique signatures of fault f stored in the dictionary would be {A, B}. In some embodiments, an average number of unique signatures U can be determined for faults in a dictionary. In such embodiments, the number of bits required to store a dictionary can be calculated as:

$$M = x*F*U \quad (2)$$

In some embodiments, a dictionary can also reflect how one or more clock signals in a circuit are associated with the scan cells where a fault effect is observed. In some embodiments, one or more clocks can be assigned values in the dictionary (e.g., one bit per clock) to indicate whether the clock signals are associated with the scan cells (e.g., whether the clock signals clock the scan cells) where the fault effect is observed. In some embodiments where each clock signal in the circuit is represented by one bit in a dictionary entry, the number of bits for storing clock signal information can be calculated as F*C, where C is the number of clocks in the circuit. As more fully explained below, the clock signal information can be used to speed up the second phase of an effect-cause diagnosis procedure.

For some exemplary embodiments that use a dictionary which stores clock signal information (1-bit-per-clock), the total number of bits M of the small dictionary is:

$$M = x*F*U + F*C \quad (3)$$

Table 1 describes six exemplary circuits. For each circuit, Table 1 lists the number of gates ($N_{Gate}$), the number of faults ($N_F$), the number of clocks ($N_{Clock}$), the number of patterns ($N_{Pattern}$), the average number of unique signatures ($N_{US}$), the size of a pass-fail dictionary for the circuit ($S_{P/F}$) and the exemplary small dictionary ($S_{SD}$) for the circuit in bytes. These six circuits are six industrial circuit designs used in obtaining experimental results described below. From Table 1, one can see that the size of the exemplary small dictionary is smaller than that of the corresponding pass-fail dictionary (in these examples, about 7% to about 55% of the size of the corresponding pass-fail dictionary).

TABLE 1

Exemplary dictionary sizes

| Design | Ckt1 | Ckt2 | Ckt3 | Ckt4 | Ckt5 | Ckt6 |
|---|---|---|---|---|---|---|
| $N_{Gate}$ | 313K | 506K | 2025K | 7051K | 5.3M | 1332K |
| $N_F$ | 631K | 1210K | 4172K | 12206K | 8701K | 2495K |
| $N_{Pattern}$ | 5000 | 6951 | 1000 | 2501 | 1000 | 1800 |
| $N_{Clock}$ | 11 | 36 | 30 | 38 | 5 | 5 |
| $N_{US}$ | 17.6 | 14.0 | 10.0 | 21.5 | 17.0 | 14.0 |

TABLE 1-continued

Exemplary dictionary sizes

| Design | Ckt1 | Ckt2 | Ckt3 | Ckt4 | Ckt5 | Ckt6 |
|---|---|---|---|---|---|---|
| $S_{P/F}$ | 394M | 1052M | 522M | 3816M | 1100M | 561M |
| $S_{SD}$ | 45M | 73M | 123M | 1108M | 600M | 142M |

Speeding Up Diagnosis Using a Small Dictionary

As explained above, in the first phase of at least some effect-cause diagnosis procedures, backward path tracing from one or more failing outputs can be used to determine an initial set of candidate faults Q. Typically the size of Q is large and the faults in Q can trigger an even larger number of events in the fault simulation. Accordingly, simulating the faults in Q to reduce the fault candidates to set Q' (which contains the faults that can actually explain the observed failing response) can be time consuming.

In some embodiments, the run time of the first phase of effect-cause diagnosis can be reduced by obtaining at least some of the initial list of candidate faults using a dictionary, for example, a "small" dictionary as described above. In some embodiments, none of the candidate faults are obtained using path tracing, while in other embodiments a portion of the candidate faults are obtained using path tracing.

Figure 4:
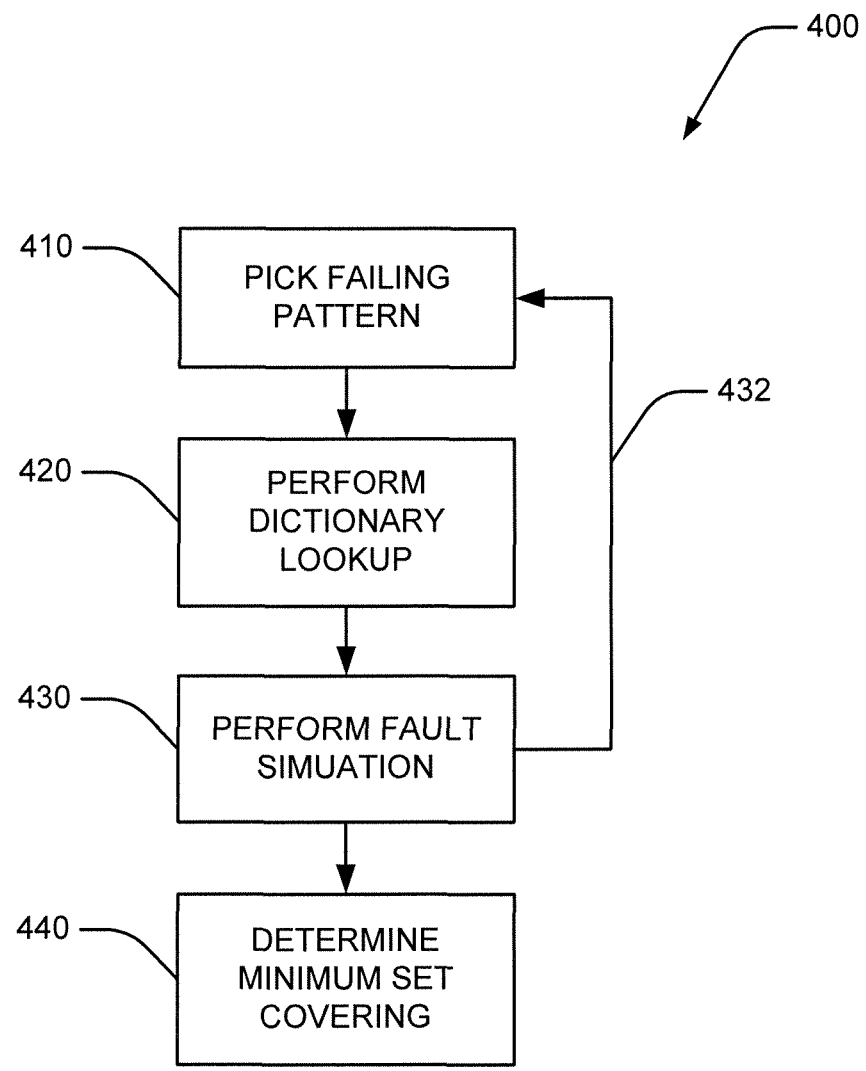
FIG. 4 is a block diagram of an exemplary embodiment of a method of using a small dictionary to determine fault candidates in an electronic circuit.

FIG. 4 shows one embodiment of an exemplary method 400 for using a small dictionary to determine fault candidates in an electronic circuit from one or more failing patterns (e.g., method 400 can be used to implement the first phase of a method such as method 300). In method act 410, a failing pattern p can be selected from a set of failing patterns G that have been applied to an electronic circuit. In method act 420, a dictionary lookup can be performed to identify a set of fault candidates H that can explain the failing pattern. In some embodiments, the method act 420 can comprise generating a compressed signature from p (e.g., using a compactor, such as a MISR, or other circuit). A dictionary can then be searched using the compressed signature. In some embodiments, the set H is smaller than set Q, while in other embodiments the set H is larger than Q. The number of events triggered by faults in H is typically much smaller than the number of events triggered by faults in Q. In method act 430, one or more of the faults in H can be simulated to find a subset of candidates H' of H which explain the failing pattern p. In at least some embodiments, it can be shown that H' is equal to Q', which is the set of faults that can be obtained after fault simulating the faults in Q derived through back tracing. (Path tracing can be performed using, for example, a netlist.) The method acts 410, 420, 430 can be repeated for other failing patterns of G, as indicated by arrow 432. In some embodiments, the method acts 410, 420, 430 are performed simultaneously (or substantially simultaneously) for multiple failing test patterns. In further embodiments, one or more of the failing patterns can be analyzed, and in method act 440 a minimum set covering algorithm can be used to find a reduced or minimum subset K of faults which can explain some or all of the failing patterns. In some embodiments, the faults in K are the final list of candidates and may be the same as the candidates in S obtained from the standard effect-cause diagnosis method described above with respect to FIGS. 1 and 2.

In some embodiments, the method 400 can be used to reduce the resources and/or time needed for fault diagnosis compared to a standard effect-cause diagnosis method. This reduction can result from, for example: reduced or no use of backward path tracing to determine the initial set of candidates that could potentially explain one or more failing patterns; and/or a typically smaller number of events triggered by the faults in the initial set of candidates H, compared to the number of events triggered by the faults in an initial set of candidates Q obtained using standard effect-cause diagnosis procedures.

Exemplary Embodiments for Selecting the Passing Patterns Based on Clock Information Generally, in effect-cause diagnosis procedures, passing pattern simulation is performed during the second phase of diagnosis and used to distinguish the defect candidates derived from the failing patterns (e.g., derived in the first phase of the procedure). For example, in one scenario two defect candidates f1 and f2 are obtained from the first phase of the effect-cause diagnosis procedure, and there are four passing patterns p1, p2, p3 and p4. If f1 and f2 are simulated over the passing patterns from p1 to p4, it may be found that f1 causes p1 to fail and f2 causes p1 and p2 to fail. Consequently, the number of passing pattern mismatches for f1 and f2 are "1" and "2," respectively. In some embodiments, the respective numbers of passing pattern mismatches for defect candidates can be used to rank the candidates (e.g., in a decreasing or increasing order) or be combined with other information to give a score for one or more defect candidates. However, for a given passing pattern, if all the defect candidates can pass the passing pattern during the logic fault simulation, then this passing pattern does not contribute to distinguishing defect candidates. Consequently, in at least some embodiments, simulation of this passing pattern is not necessary. In the above example, for instance, defect candidates f1 and f2 pass both p3 and p4 during the fault simulation. Thus, p3 and p4 do not help to distinguish f1 from f2, and simulation of p3 and p4 is not necessary for diagnosing faults in the circuit. If a subset of the total passing patterns which contribute to distinguishing the defect candidates derived from the first phase of effect-cause diagnosis can be selected, the run time of the effect-cause diagnosis can be reduced. Thus, one issue in fault diagnosis that is addressed by embodiments of the disclosed technology is how to select a subset of the total passing patterns that can effectively distinguish the defect candidates. This issue is more formally presented as follows:

Given a set D of defect candidates derived from the first phase of an effect-cause diagnosis procedure and a set V of passing patterns, and given a subset P of the total passing patterns that can cause at least one defect candidate in D to fail, the problem (according to one embodiment) is how to select a subset L of the total passing patterns V such that the size of the intersection of L and P is relatively large (e.g., as large as possible or maximal (L contains P)) but the size of L is relatively small (e.g., as small as possible or minimal). With respect to diagnosis methods that involve passing patterns (e.g., effect-cause diagnosis), in general, the smaller the size of L, the greater the speed up of the method (e.g., the greater the speed up of the second phase).

Figure 5:
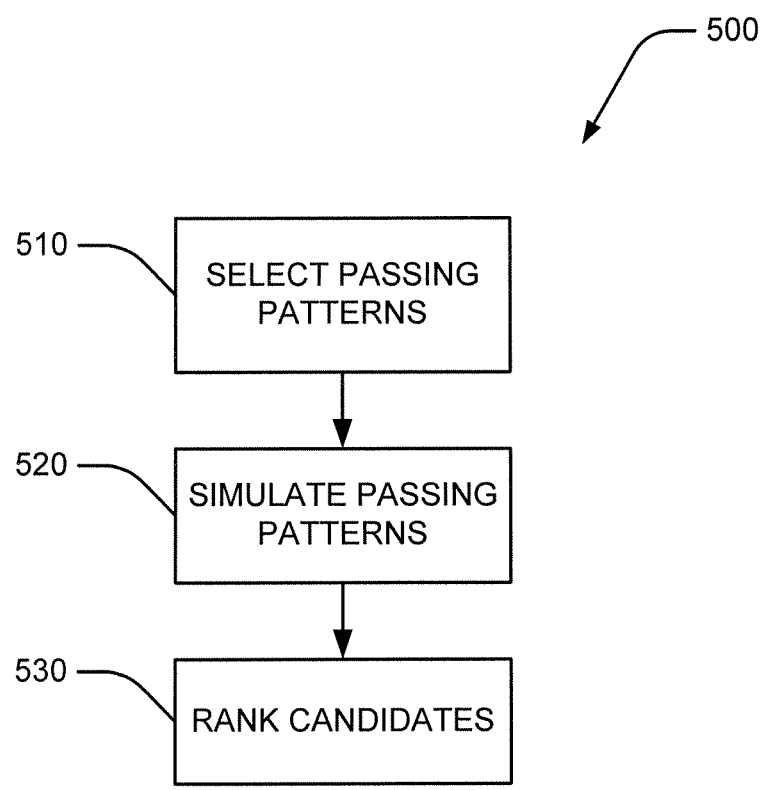
FIG. 5 is a block diagram of an exemplary embodiment of a method of performing fault diagnosis.

FIG. 5 shows a block diagram of an exemplary embodiment of a method 500 of performing fault diagnosis (e.g., method 500 can be used to implement the second phase of an effect-cause diagnosis technique). Given a set of passing patterns, in method act 510, one or more patterns are selected from the set according to one or more criteria. In method act 520, the selected passing patterns are used in fault simulation. In method act 530, one or more defect candidates can be ranked according to the results of the simulation.

Circuit designs often make use of several clocks (e.g., several different clock signals of varying frequency and/or pulse width). Multiple clocks are sometimes used to save power by clock gating and/or to allow the design to communicate with parts of the external environment running asynchronously. In some embodiments, information regarding one or more circuit clocks can be used to select one or more passing patterns for simulation (e.g., as part of method act 510). For example, a subset of the total passing patterns to simulate can be selected based on which of a plurality of clocks (e.g., one or more clocks) was pulsed or active when one or more defect candidates of D failed a test. This information can be recorded separately for each fault.

During the process of automatic test pattern generation (ATPG) for a circuit design comprising multiple clocks, typically only one clock is pulsed for each test pattern. In cases where multiple clocks are compatible with each other, the multiple clocks can be pulsed simultaneously for one test pattern in order to reduce the total test pattern count. For a given test pattern, the one or more clocks which are pulsed for the test pattern can be determined, as explained below.

An example of a test pattern generated by a commercial ATPG tool appears in FIG. 6. The particular format of the test pattern shown in FIG. 6 should not be construed as limiting, as the technologies described herein can generally be used with test patterns generated in a variety of formats and using a variety of methods. In this example, procedure clock "clk3" describes how the clocks are pulsed when this pattern is applied. In the procedure clock "clk3", there are three clocks (/clk_in, /clk_tn and /xclk_in) involved, but only clock /xclk_in is pulsed (e.g., set to a value of "1") in this exemplary pattern.

In at least some electronic circuit designs, in order to improve circuit controllability and observability, a plurality of scan chains are inserted into the design. If the faulty effect of a fault f can only be observed at one or more scan cells of the subset S of the total scan cells for each test pattern of a given test set, the subset T' of the total test patterns which are pulsed by the clocks associated with the scan cells in S is a superset of the test patterns where the fault f is detected.

For example, assume there is a fault f1 which is detected by the test patterns P1, P2 and P3 of a given test set. With test patterns P1, P2 and P3, the faulty effects of the fault f are observed at the scan cells SC1, SC2 and SC3, respectively. The clocks associated with the scan cells SC1, SC2 and SC3 are CLK1, CLK2 and CLK1, respectively. In this case, it follows that the fault f can be detected by test patterns where either CLK1 or CLK2 is pulsed, although other clocks can be present in the circuit. Because there can be at least some test patterns where either CLK1 or CLK2 is pulsed (or where both are pulsed) but where the fault f is not detected, the set of test patterns where CLK1 and CLK2 are pulsed is a superset S of the test patterns P1, P2 and P3 where fault f is detected.

In some embodiments, a dictionary comprising clock information (such as a dictionary similar to the one whose size is described by equation 3 above) is used to select one or more passing patterns for simulation. In method act 510 of method 500, for example, one or more passing patterns can be selected in part by searching one or more small dictionaries to identify one or more clocks that are associated with one or more fault candidates (e.g., the fault candidates obtained in a first phase of an effect-cause diagnosis method or other method). Passing patterns for fault simulation can then be selected which pulse at least one of these clocks. In at least some embodiments, it can be shown that the selected subset of passing patterns is a superset of patterns that can cause a passing mismatch, which is generally a goal of the second phase of an effect-cause diagnosis method. Thus, in at least some embodiments, little or no loss of diagnostic accuracy is introduced by the method 500.

In further embodiments, path tracing can be used to select one or more passing patterns for simulation. For example, in one exemplary embodiment, structure forward tracing is performed from defect candidate locations (e.g., the fault candidates obtained in a first phase of an effect-cause diagnosis method or other method). The forward tracing can be performed to primary outputs or scan cells. If there are one or more defect candidates that can propagate the faulty effect to primary outputs, then, according to one exemplary embodiment, all passing patterns are chosen for simulation. Otherwise, if the defect candidates can only propagate the faulty effect to scan cells, the clocks which are associated with the scan cells where the faulty effect of the defect candidates can be observed are determined. According to one exemplary embodiment, the set of passing patterns associated with at least one of the determined clocks is selected for simulation.

Exemplary embodiments for selecting passing test patterns for fault simulation can incorporate any one or more aspects of the techniques discussed above.

Figure 7:
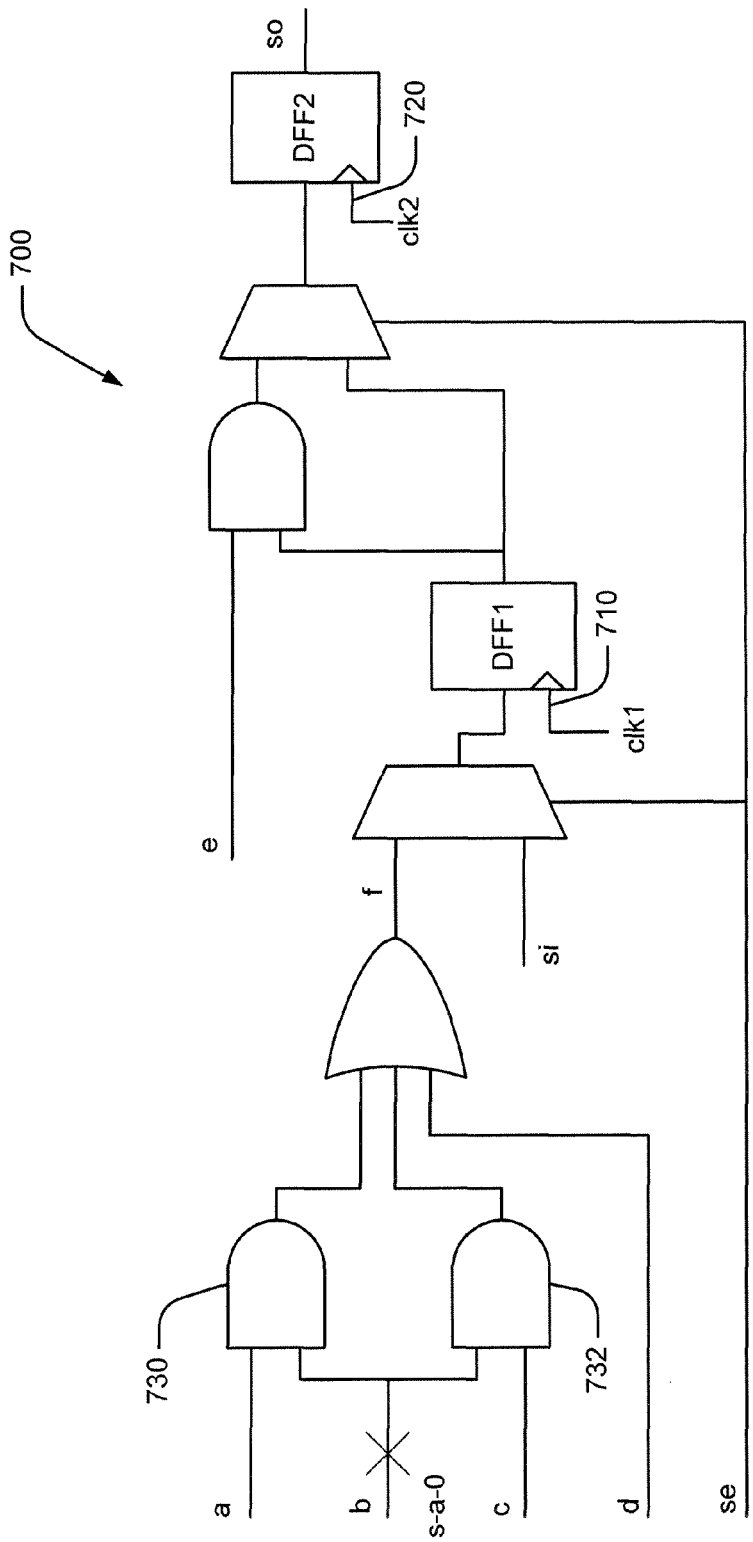
FIG. 7 shows a block diagram of an exemplary circuit.
Figure 8:
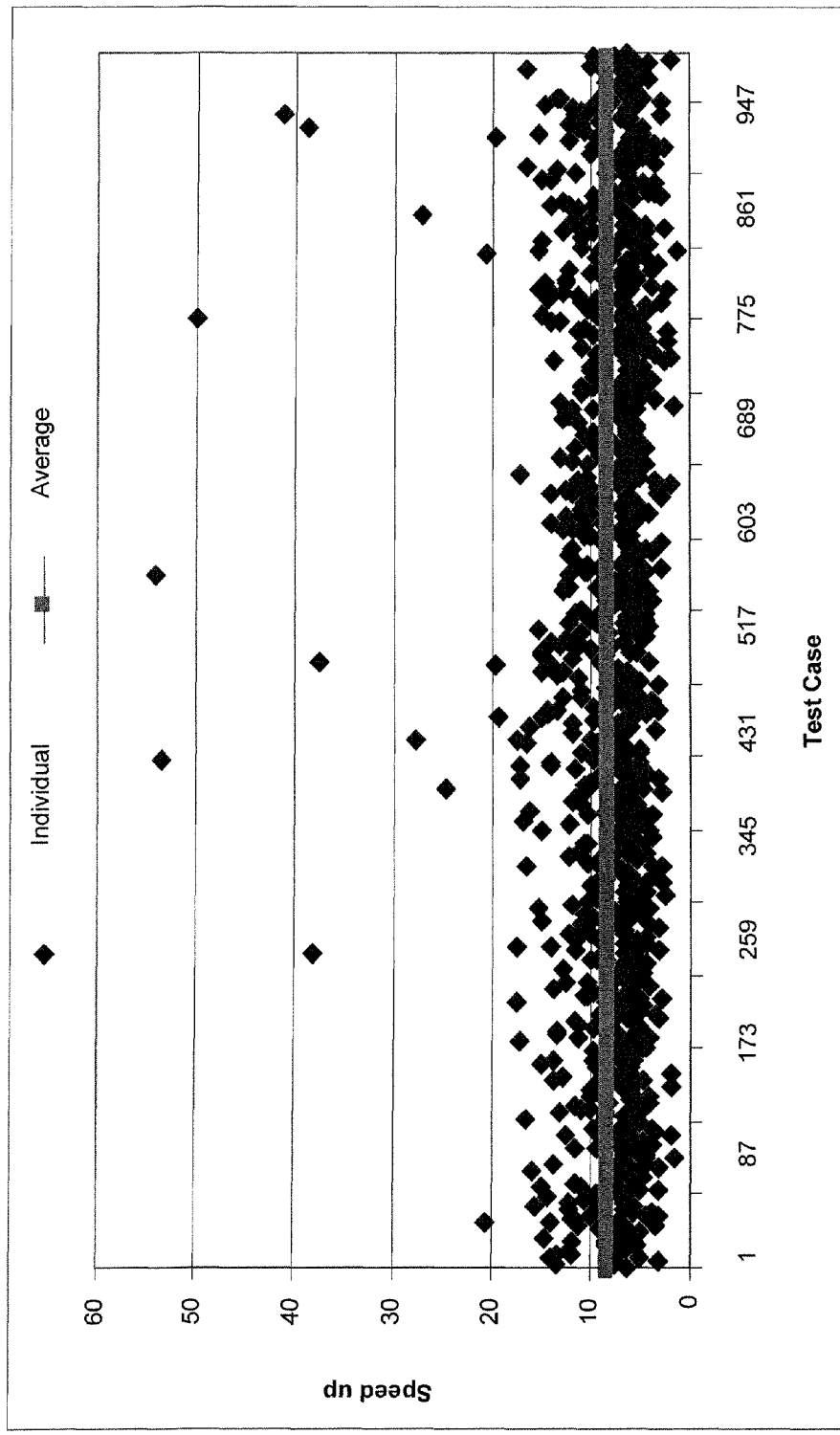
FIG. 8 shows a graph describing experimental results for Ckt1 of Table 1 using embodiments of the disclosed technologies.
Figure 9:
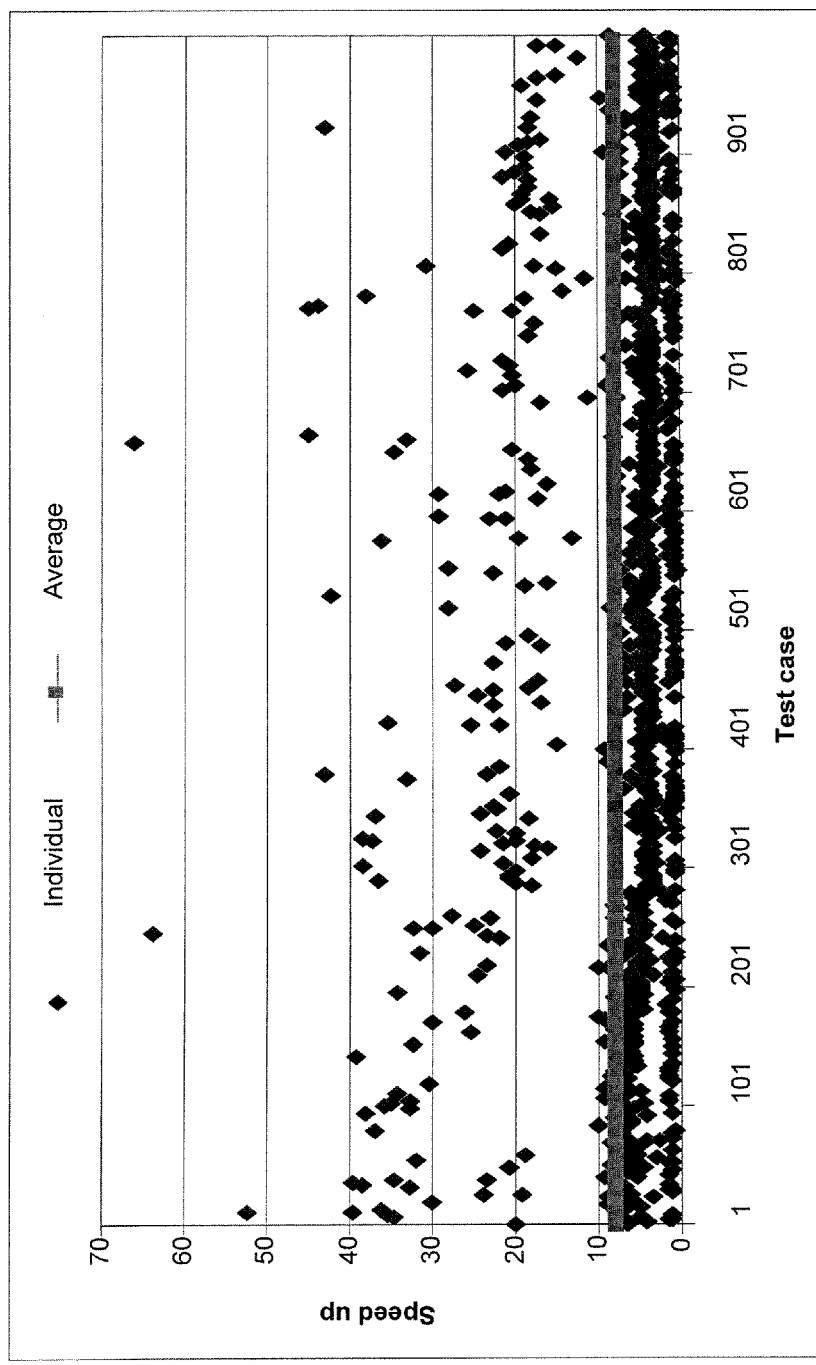
FIG. 9 shows a graph describing experimental results for Ckt2 of Table 1 using embodiments of the disclosed technologies.
Figure 10:
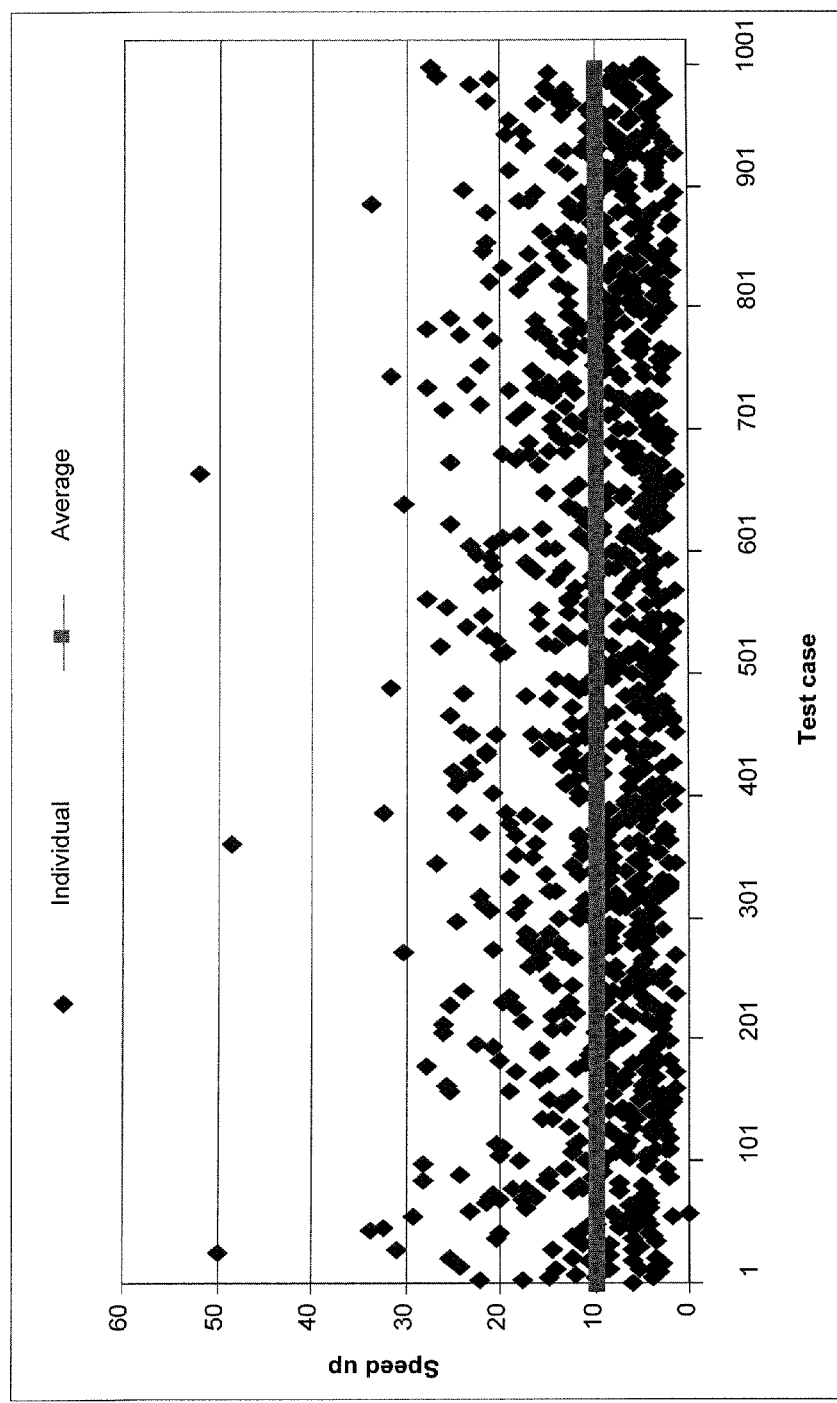
FIG. 10 shows a graph describing experimental results for Ckt3 of Table 1 using embodiments of the disclosed technologies.
Figure 11:
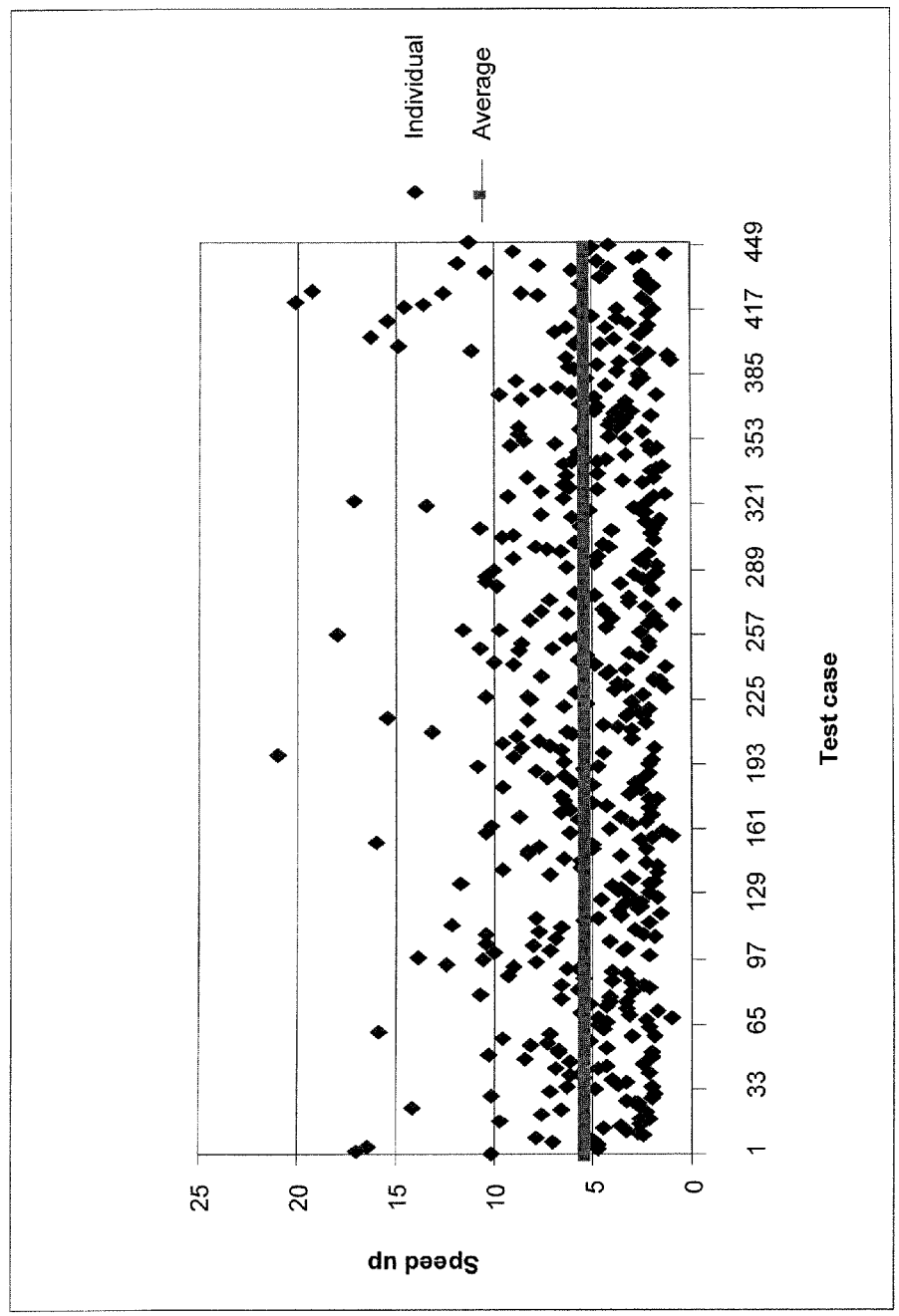
FIG. 11 shows a graph describing experimental results for Ckt4 of Table 1 using embodiments of the disclosed technologies.
Figure 12:
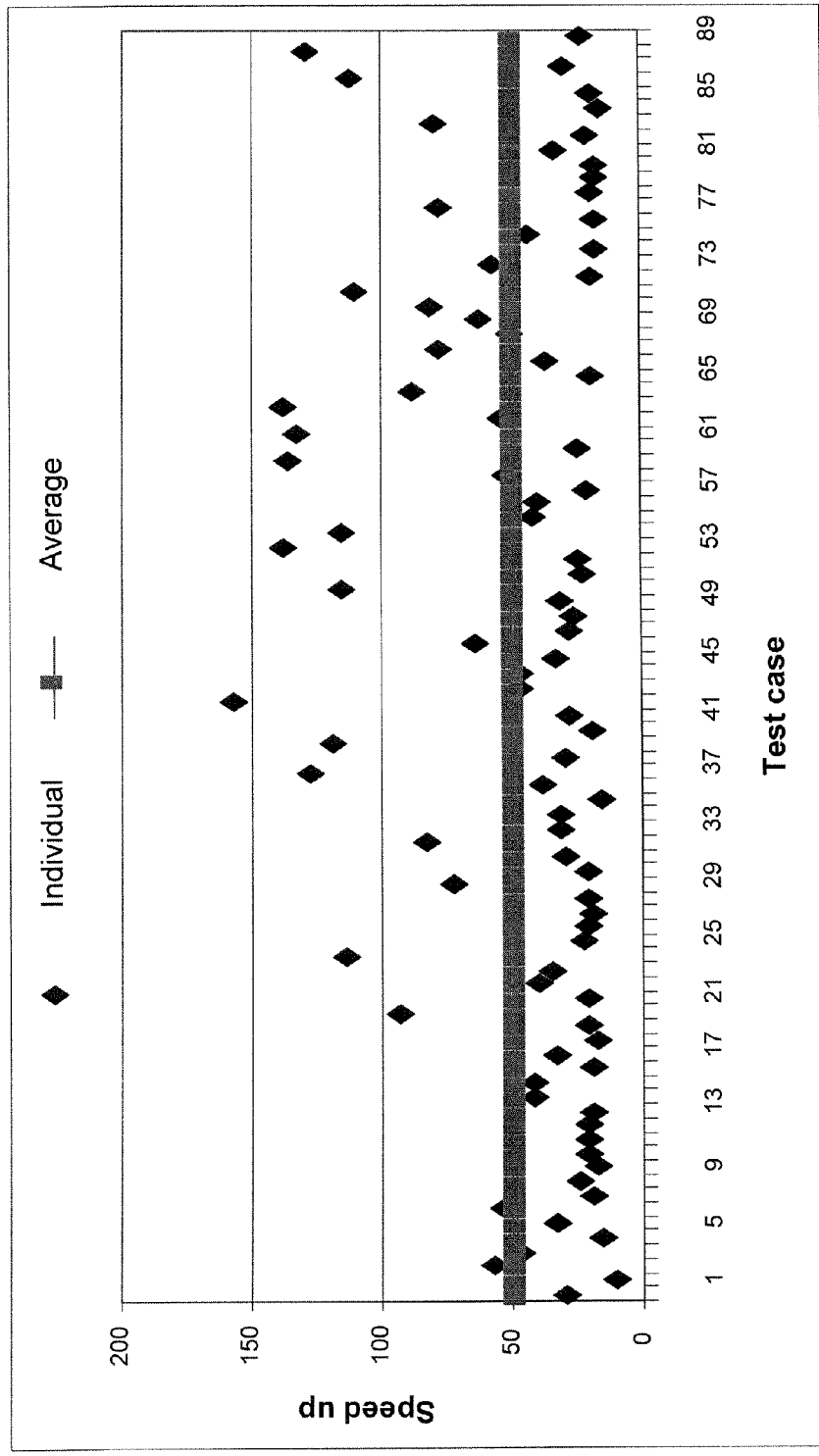
FIG. 12 shows a graph describing experimental results for Ckt5 of Table 1 using embodiments of the disclosed technologies.
Figure 13:
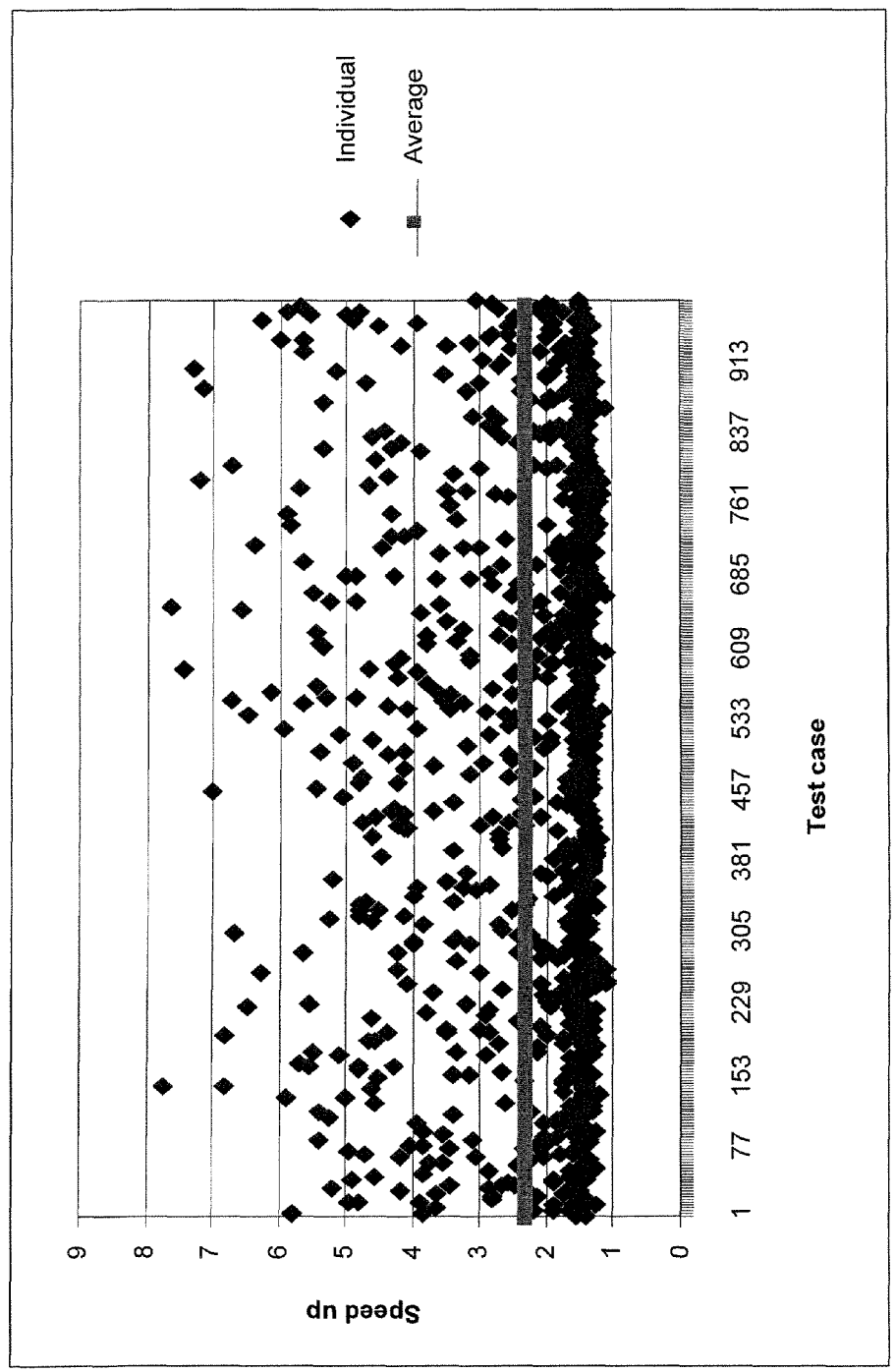
FIG. 13 shows a graph describing experimental results for Ckt6 of Table 1 using embodiments of the disclosed technologies.

The following example illustrates one exemplary procedure. FIG. 7 shows a circuit 700 configured to receive two clock signals, clk1 at an input 710 to flip-flop DFF1 and clk2 at an input 720 to flip-flop DFF2, respectively. In the depicted configuration, DFF1 and DFF2 are connected serially to form a scan chain. Assume for purposes of this example that there is a stuck-at-0 defect at input pin b, which provides inputs to AND gates 730, 732. After applying a test pattern set T shown in Table 2 to the circuit of FIG. 7, the failures are only observed at DFF1 from test pattern P1 and P2. From the failing patterns P1 and P2, an effect-cause defect diagnosis identifies fault b/0 (wherein the notation "x/y" indicates x-stuck-at-y) and f/0 as the initial defect candidates, and then simulates b/0 and f/0 over all the passing patterns P3, P4 and P5. In this case, with the test pattern set T, f/0 will cause passing pattern P3 to fail, but b/0 will pass all the passing patterns in the set. Thus, in some embodiments, an effect-cause defect diagnosis ranks the candidate b/0 higher than f/0, since b/0 has less of a passing pattern mismatch.

TABLE 2

Exemplary test pattern set

| Test Pattern | A | b | c | d | e | si | se | clk1 | clk2 | DFF1 | DFF2 |
|---|---|---|---|---|---|---|---|---|---|---|---|
| P1 | 1 | 1 | 0 | 0 | X | X | 0 | pulse | 0 | X | X |
| P2 | 0 | 1 | 1 | 0 | X | X | 0 | pulse | 0 | X | X |
| P3 | 1 | 0 | 1 | 1 | X | X | 0 | pulse | 0 | X | X |
| P4 | X | X | X | X | 1 | X | 0 | 0 | pulse | 1 | X |
| P5 | X | X | X | X | 0 | X | 0 | 0 | pulse | 1 | X |

According to the exemplary method described above, for the circuit 700, since b/0 and f/0 can only propagate the faulty effect to DFF1, b/0 and f/0 can only be detected by the test patterns where the clock clk1 is pulsed. Consequently, in some embodiments only passing pattern P3 is simulated, instead of simulating P3, P4 and P5. Therefore the number of passing patterns simulated can be reduced from 3 to 1.

Direct Diagnosis Using Compacted Test Data

In some electronic circuits, compression techniques can be used to reduce the test data volume and test application time. However, performing fault diagnosis from the compacted failure data can be a challenge. Some methods try to first identify the failed scan cells from the compressed failure data by using some heuristics, followed by a regular fault diagnosis procedure to perform the diagnosis from the identified failing scan cells. Such proposed methods can work for a specific compaction scheme, but do not necessarily work for an arbitrary compaction scheme. Instead of identifying the failed scan cells from compacted failure data, another method performs the diagnosis directly from the compacted failure data. Embodiments of these direct diagnosis techniques are described in U.S. Patent Application Publication Nos. 2004/0190331 and 2005/0222816, all of which are hereby incorporated herein by reference. In general, the diagnostic procedure of these latter methods first finds the potential faults which can contribute to the observed compressed failures. Fault simulations are then used to reduce the fault candidates. Due to the information loss caused by the test response compactor used in this approach, the number of potential fault candidates derived from the compacted failure is typically larger than the potential fault candidates derived by a back tracing procedure in conventional effect-cause diagnosis approaches. Therefore the run time for direct diagnosis is typically longer than for conventional effect-cause diagnosis approaches. For a compactor with memory elements like a MISR, for instance, it can be difficult for direct diagnosis techniques to identify potential fault candidates within a manageable amount of simulation time.

The exemplary small dictionary based diagnosis procedures disclosed herein diagnose faults directly from compacted failure data. In at least some embodiments, this can be done within a shorter run time than required by some of the diagnosis procedures described above. When an exemplary small dictionary is created for an electronic circuit comprising a test response compactor, one or more faults in the design can be simulated, and the unique compressed signatures generated by the test response compactor in the design for each fault can be stored. In cases where the compacted signature is larger than a selected size (e.g., larger than 32 bits), the signature can be further compacted to be no larger than the selected size. In particular embodiments, this can be done using a MISR or other compactor (or simulation of a MISR or other compactor). During diagnosis, in some exemplary approaches, the small dictionary can be searched to obtain the potential fault candidates for one or more observed compacted failure signatures. The potential fault candidates, in this example, are the faults whose unique signatures contain the observed compacted fail signature. Embodiments of this approach can be compactor independent.

Experimental Results

To evaluate the run time speed up using embodiments of the diagnosis methods introduced above, experiments were conducted on six circuit designs described above in Table 1. To produce these results, a modified version of a commercial effect-cause diagnosis tool was used with a small dictionary for 32-bit signatures, having a size 32*F*U+F*C, as was described above. The gate count, the number of test patterns, and the number of faults are listed in Table 1. For designs Ckt1, Ckt2 and Ckt6, 1000 test cases were created for each design by injecting defects. For design Ckt5, only 89 test cases were created due to its long simulation times. For these three circuits, in each test case, one single stuck-at fault was injected into the circuit and the faulty circuit was simulated to collect the failure responses. The failure responses were used in the diagnosis. For Ckt3 and Ckt4, actual failure data collected from the tester was used for diagnosis. For Ckt3 and Ckt4, 1000 and 449 test cases (respectively) were created. The experimental results for the designs Ckt1 to Ckt6 are reported in FIGS. 8-13, respectively. In these figures, the x-axis identifies test cases, whereas the y-axis indicates the speed up factor for the test cases. Each dot in the figure corresponds to an individual test case, and the thick horizontal line is the average speed up for all test cases. From FIGS. 8-13, it can be seen that the illustrated examples can speed up the effect-cause diagnosis substantially, such as up to about 160 times. The average and median speed up for the designs Ckt1 to Ckt6 are, respectively: 8.0 and 6.6; 7.8 and 4.4; 9.6 and 7.9; 5.3 and 4.4; 48 and 31; and 2.3 and 1.6. For these circuits, the overall diagnosis times are reduced (on average) by these respective average speed up values.

In these results, Q and H are, respectively, the sets of candidate faults that are simulated in the standard effect-cause procedure and the disclosed procedure using a small dictionary. In Table 3, "AVG Q" is the average number of faults in Q over results for all the test cases in the respective circuits. "AVG H" is the average number of faults in H over results for all the test cases in the respective circuits. "EVE Q" is the average number of events triggered by the faults in Q during the fault simulation for each test case in the respective circuits. "EVE H" is the average number of events triggered by the faults in H during the fault simulation for each test case in the respective circuits. "AVE SF" is the average speed up of the first phase of the effect-cause diagnosis technique, and "AVE SP" is the average speed up of the second phase of the effect-cause diagnosis technique. "AVE" and "Median" are, respectively, the average and median speed up factors of the complete diagnostic procedure.

The results described in Table 3 show that the disclosed technologies can reduce the number of events in fault simulation, though the average number of faults in H may be larger than Q. Experiments show that this second point is due to the fact that while the faults in set H propagate events only in the input cones of the outputs that produced faulty values during the application of a failing pattern, the faults in Q tend to propagate events to many circuit outputs. The results also show that the second phase is not speeded up by the proposed method for Ckt3 and Ckt5. At least part of the reason for this is that the test patterns for Ckt3 and Ckt5 are clock compacted. In each pattern for Ckt3 and Ckt5, all clocks are pulsed and the information on clocks used can not help select a smaller subset of passing pattern for simulation. As seen from Table 3, however, the overall diagnostic procedure is speeded up for all circuits, as seen from Table 3.

TABLE 3

Experimental results for four industrial circuits

| | Circuit | | | |
|---|---|---|---|---|
| | Ckt 1 | Ckt 2 | Ckt 3 | Ckt 5 |
| AVG Q | 134 | 51 | 210 | 794 |
| AVG H | 197 | 141 | 154 | 219 |
| AVG Q/AVG H | 0.68 | 0.36 | 1.36 | 3.6 |
| EVE Q | 2046.4K | 380K | 72.4M | 2680M |
| EVE H | 45.6k | 48K | 143K | 1.1M |
| EVE Q/EVE H | 45 | 7.9 | 506 | 2436 |
| AVE SF | 10.5 | 2.6 | 24 | 211 |
| AVE SP | 6.3 | 8.9 | 1 | 1 |
| AVE | 8 | 7.8 | 9.6 | 48 |
| Median | 6.6 | 4.4 | 7.9 | 31 |

Figure 14:
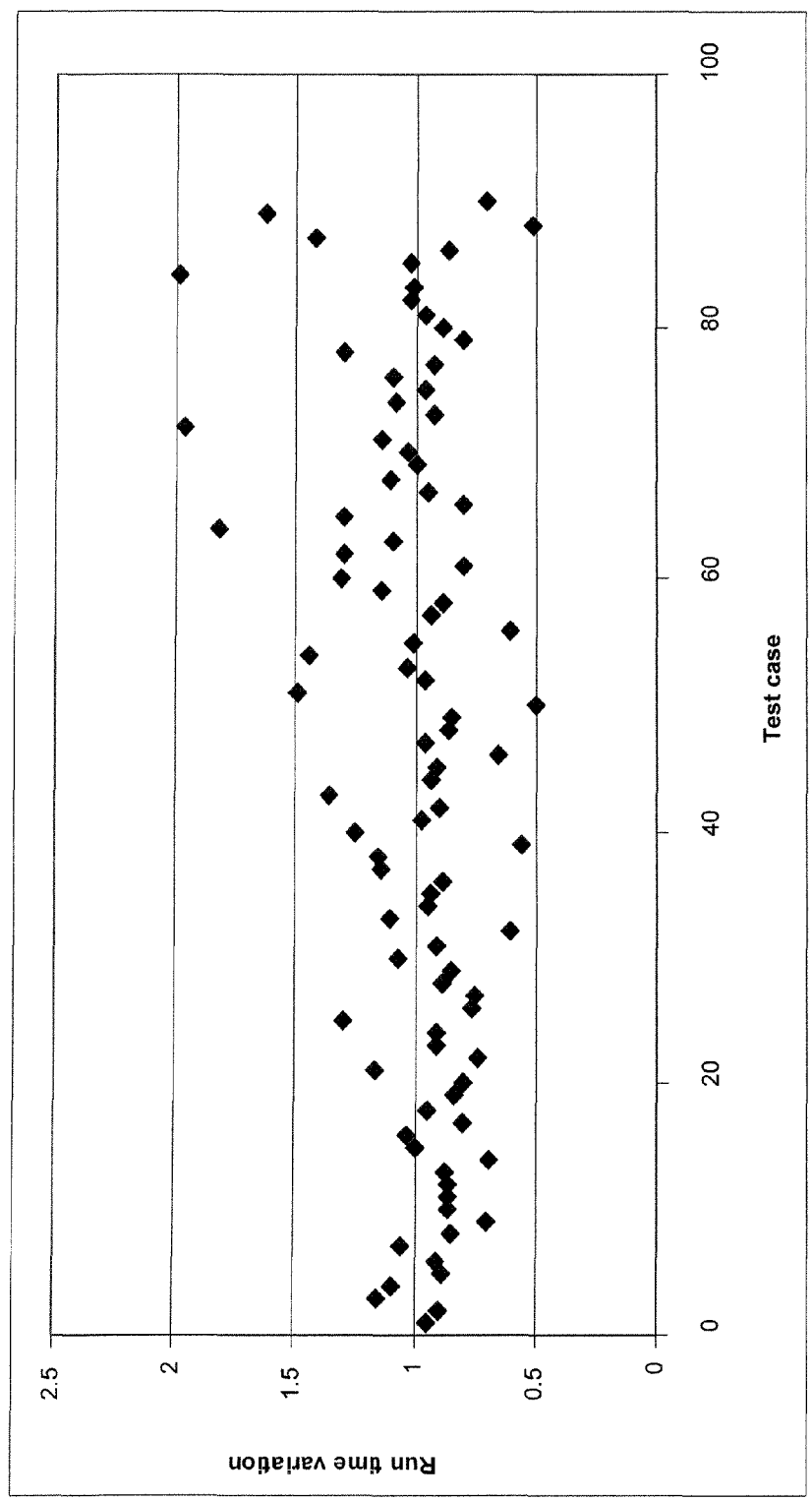
FIG. 14 is a plot of experimental results for Ckt5 of Table 1 using embodiments of the disclosed technologies.
Figure 15:
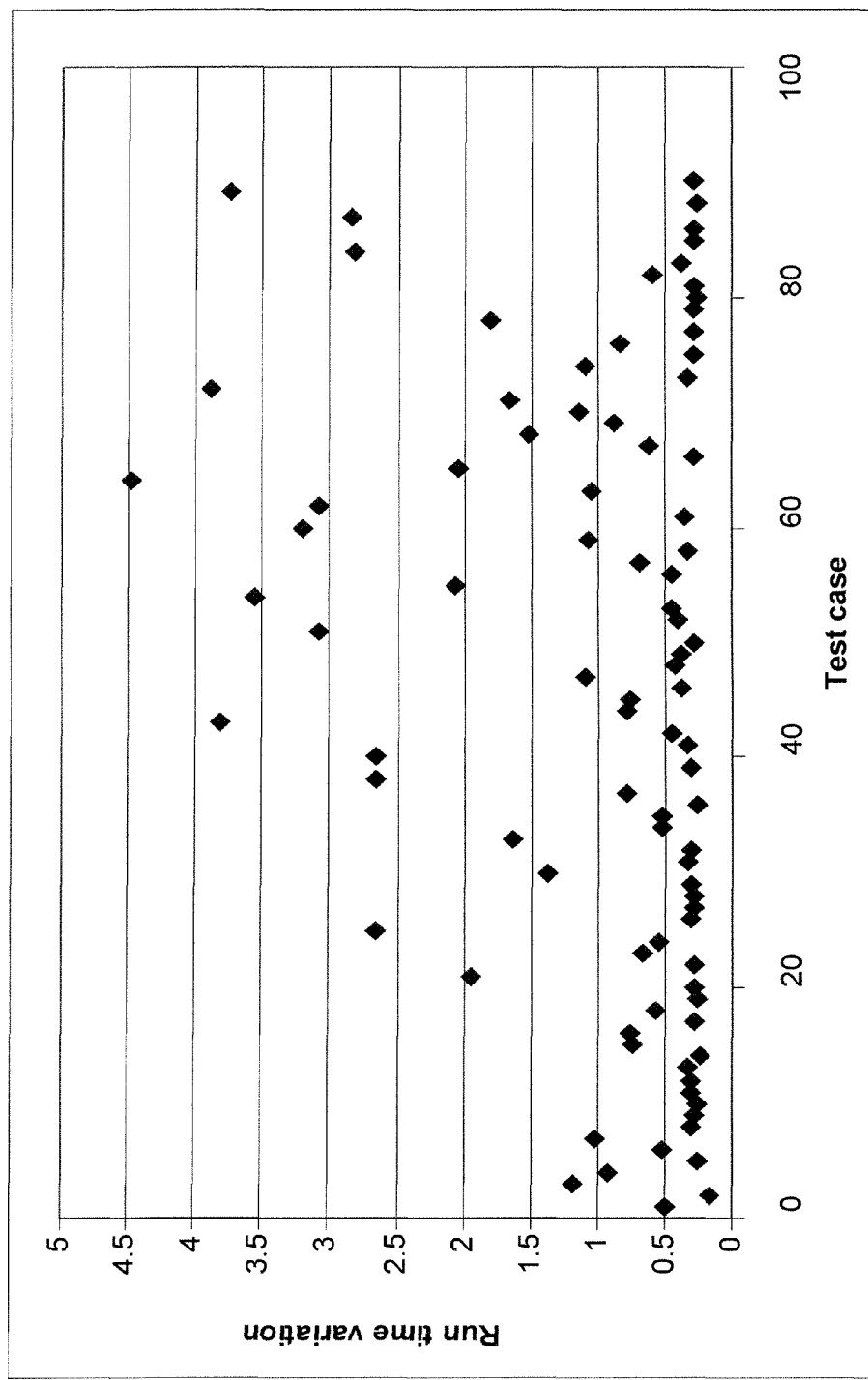
FIG. 15 is a plot of experimental results for Ckt5 of Table 1 using embodiments of the disclosed technologies.

The results show that the run time of the disclosed method (as applied to these circuits) does not vary widely for different diagnosis instances, as at least some of the standard effect-diagnosis procedures do. For example, FIGS. 14 and 15 show plots of normalized run times of the diagnosis procedures described above applied to Ckt5. FIG. 14 shows values for the diagnosis procedure run with the proposed dictionary, while FIG. 15 shows values for the diagnosis procedure run without the proposed dictionary. It can be seen that the values in FIG. 14 vary more widely than those in FIG. 15.

An additional set of experiments were conducted on three industry circuits having multiple clocks. Information about these three industry circuits is listed in Table 4, which shows for each circuit the circuit name, the gate count of the circuit, the number of test patterns, and the number of the clocks in the circuit.

TABLE 4

Industry circuits used in some reported experiments

| Circuit | Gate Count | No. of Test Patterns | No. of Clocks |
|---|---|---|---|
| IN1 | 313K | 5000 | 11 |
| IN2 | 506K | 6951 | 36 |
| IN3 | 1089K | 2062 | 14 |

For each circuit, 1000 test cases were created. In each test case, one single stuck-at defect was injected into the circuit and the defective circuit was simulated to collect failure responses. The failure responses were used later for fault diagnosis. For each test case, a commercial effect-cause diagnosis tool was used to find the initial defect candidates F and then to simulate the defect candidates over all the passing patterns E to record a subset V of the passing patterns which can cause at least one defect candidate in F to fail.

The exemplary passing pattern selection method described above and using clock information was also used to find a subset Y of the total passing patterns. The intersection of V and Y is denoted as L. In the experiments, two parameters were defined to evaluate the effectiveness of the exemplary method: Simulation Ratio and Fail Coverage. The two parameters can be defined as follows:

$$\text{Simulation Ratio} = (100 * \text{the size of } Y / \text{the size of } E)\% \qquad (4)$$

$$\text{Fail Coverage} = (100 * \text{the size of } L / \text{the size of } V)\% \qquad (5)$$

In general, the higher the Fail Coverage is, the less information is lost for the diagnosis. Further, the lower the Simulation Ratio is, the greater the speed up is in diagnosis. Desirably, a Fail Coverage of 100% is obtained with a Simulation Ratio that is as small as possible.

Figure 29:
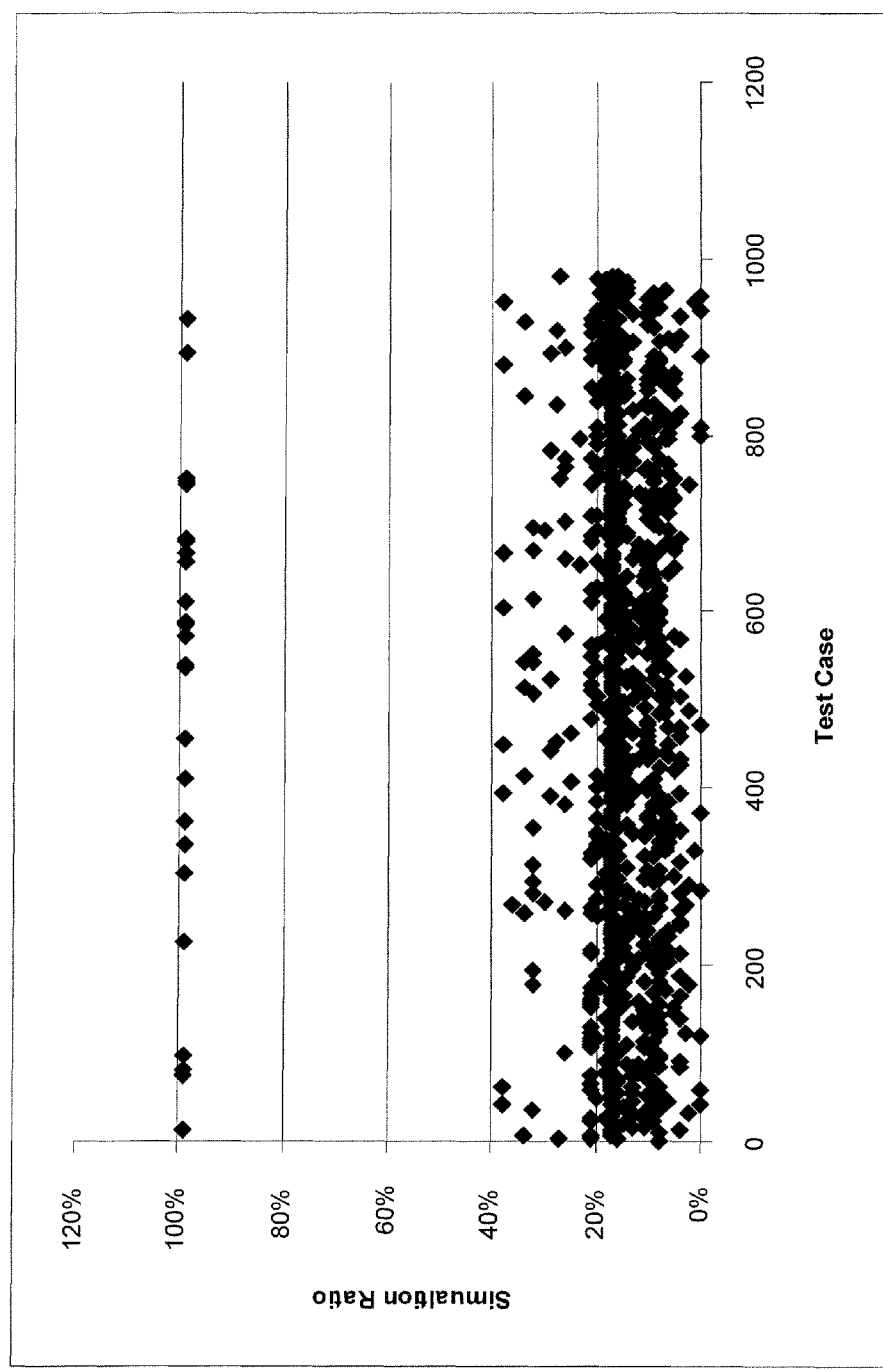
FIG. 29 shows experimental results of using exemplary passing pattern selection methods.
Figure 30:
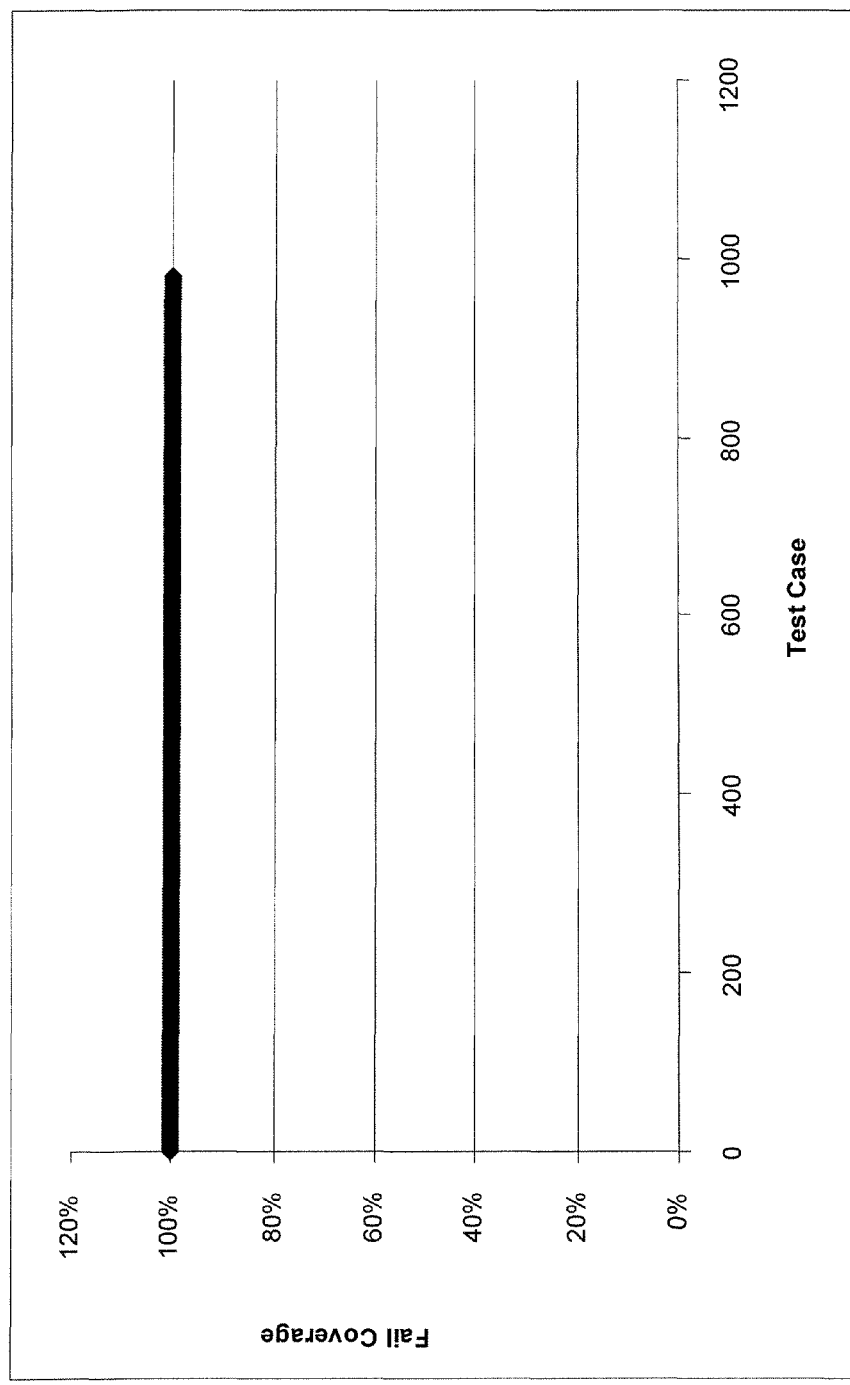
FIG. 30 shows experimental results of using exemplary passing pattern selection methods.
Figure 31:
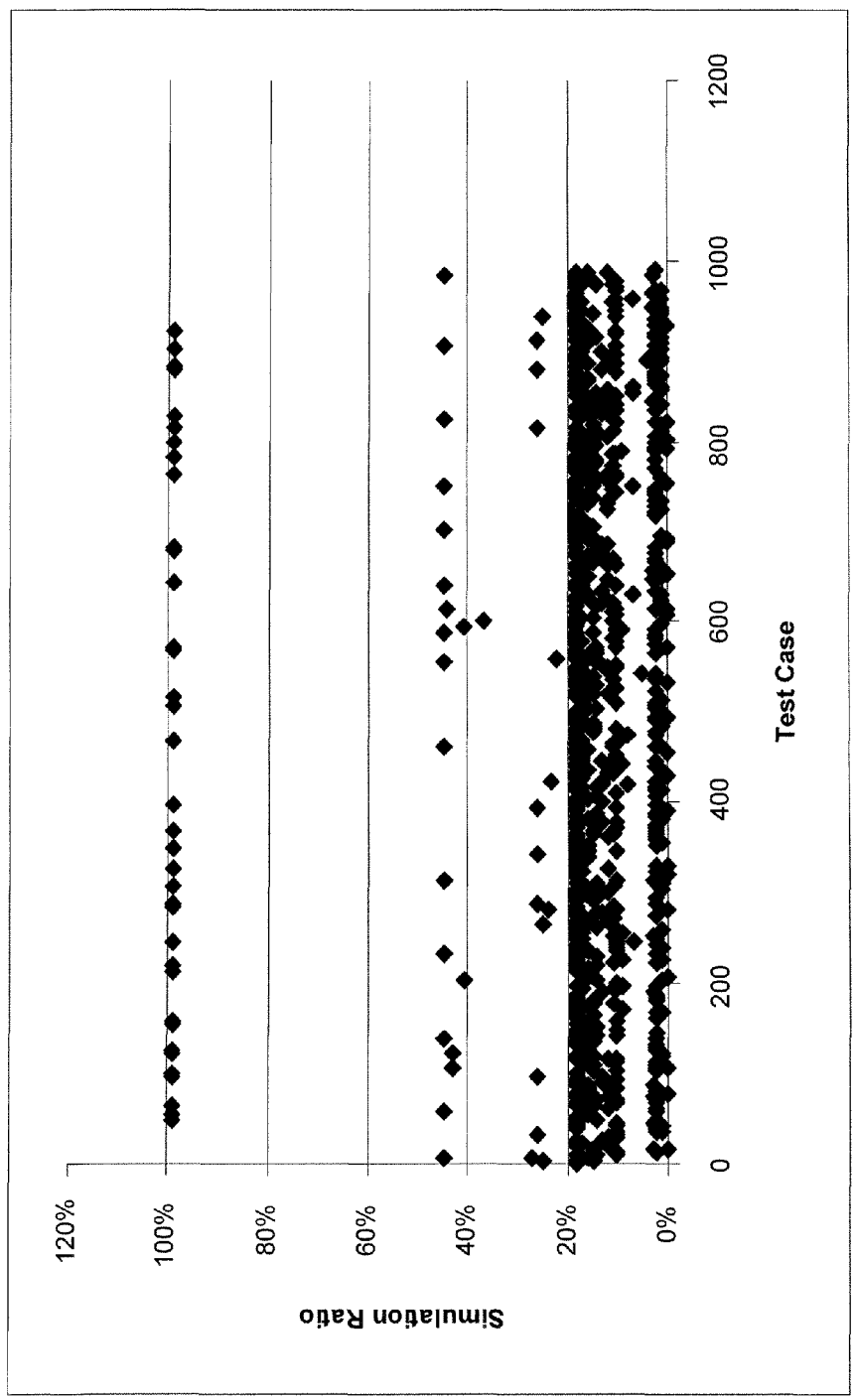
FIG. 31 shows experimental results of using exemplary passing pattern selection methods.
Figure 32:
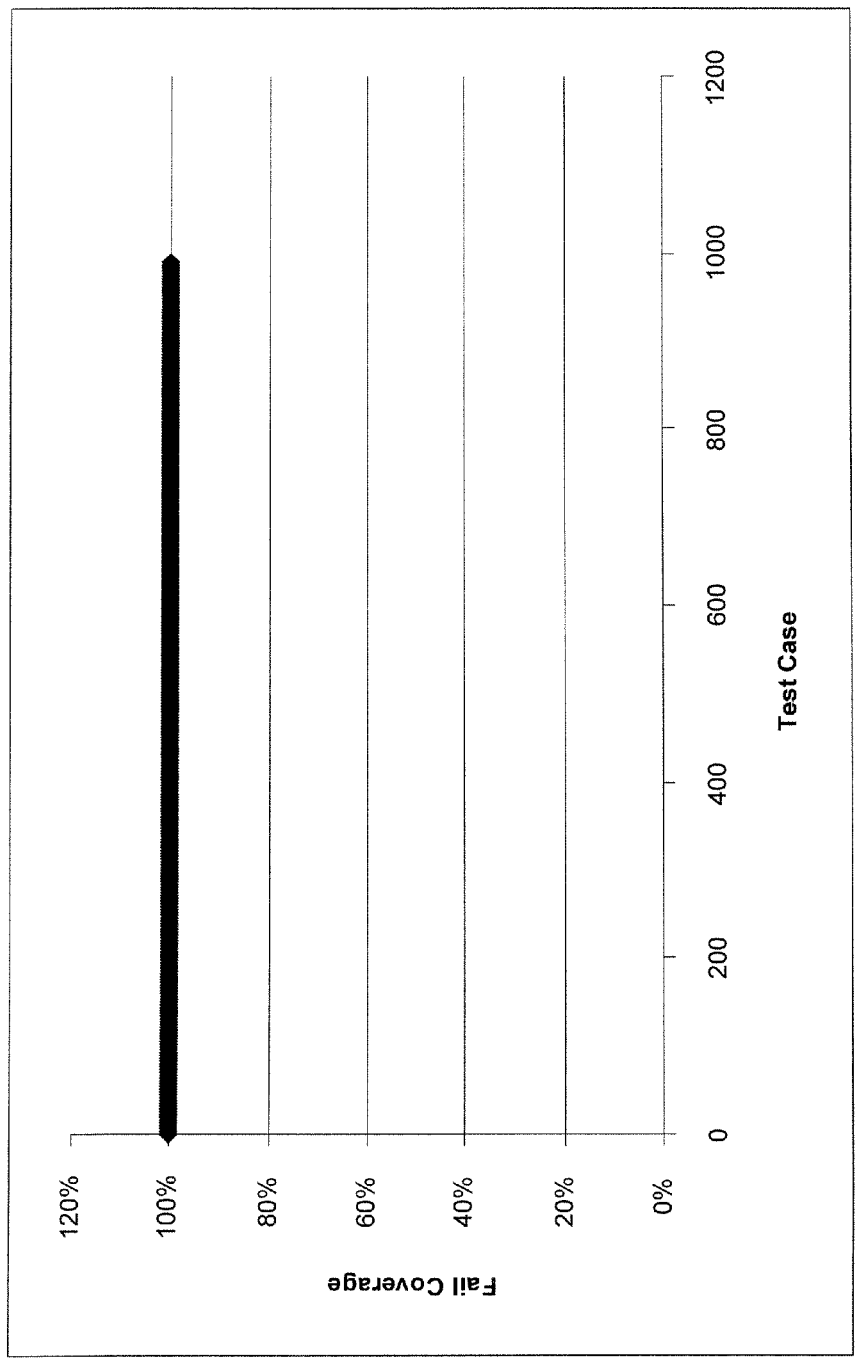
FIG. 32 shows experimental results of using exemplary passing pattern selection methods.
Figure 33:
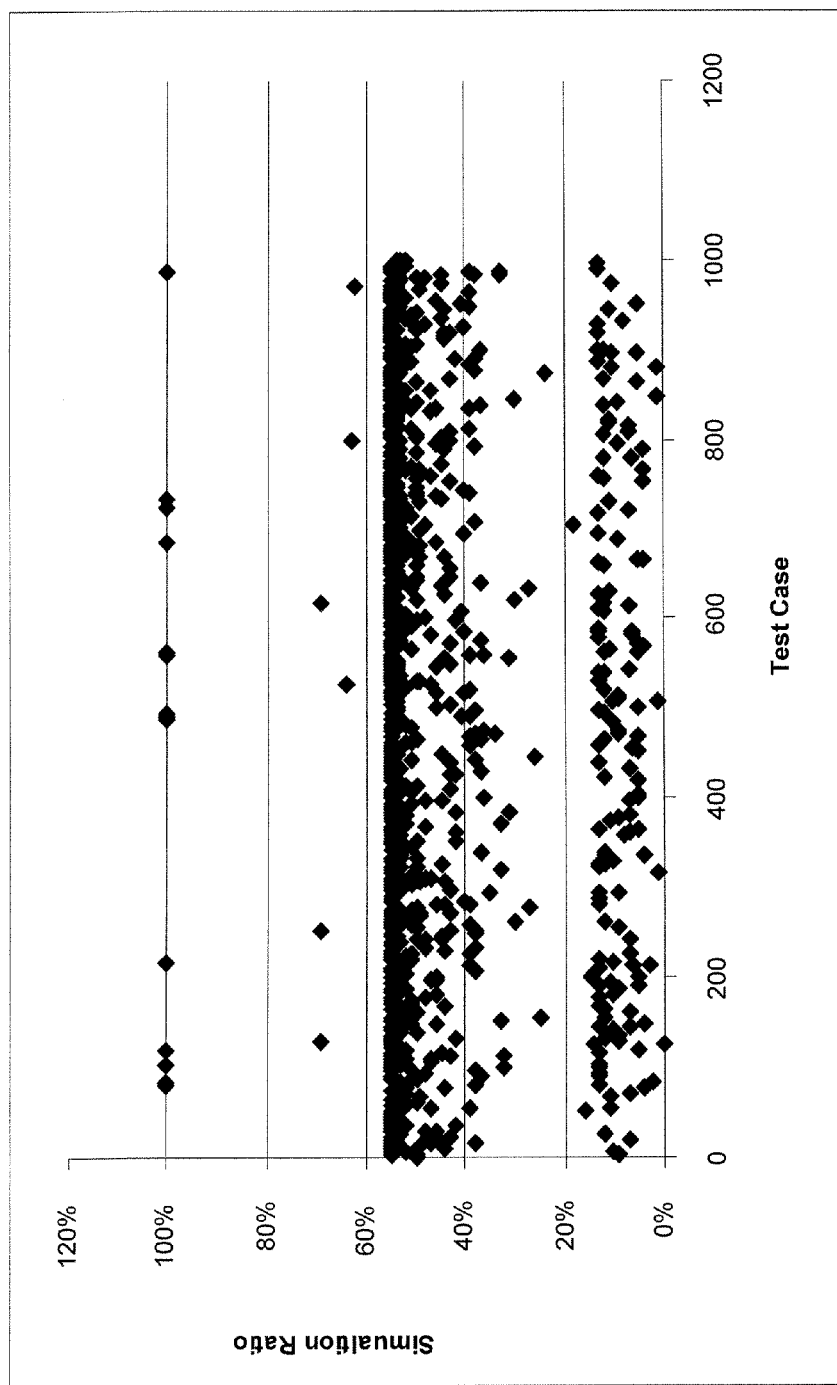
FIG. 33 shows experimental results of using exemplary passing pattern selection methods.
Figure 34:
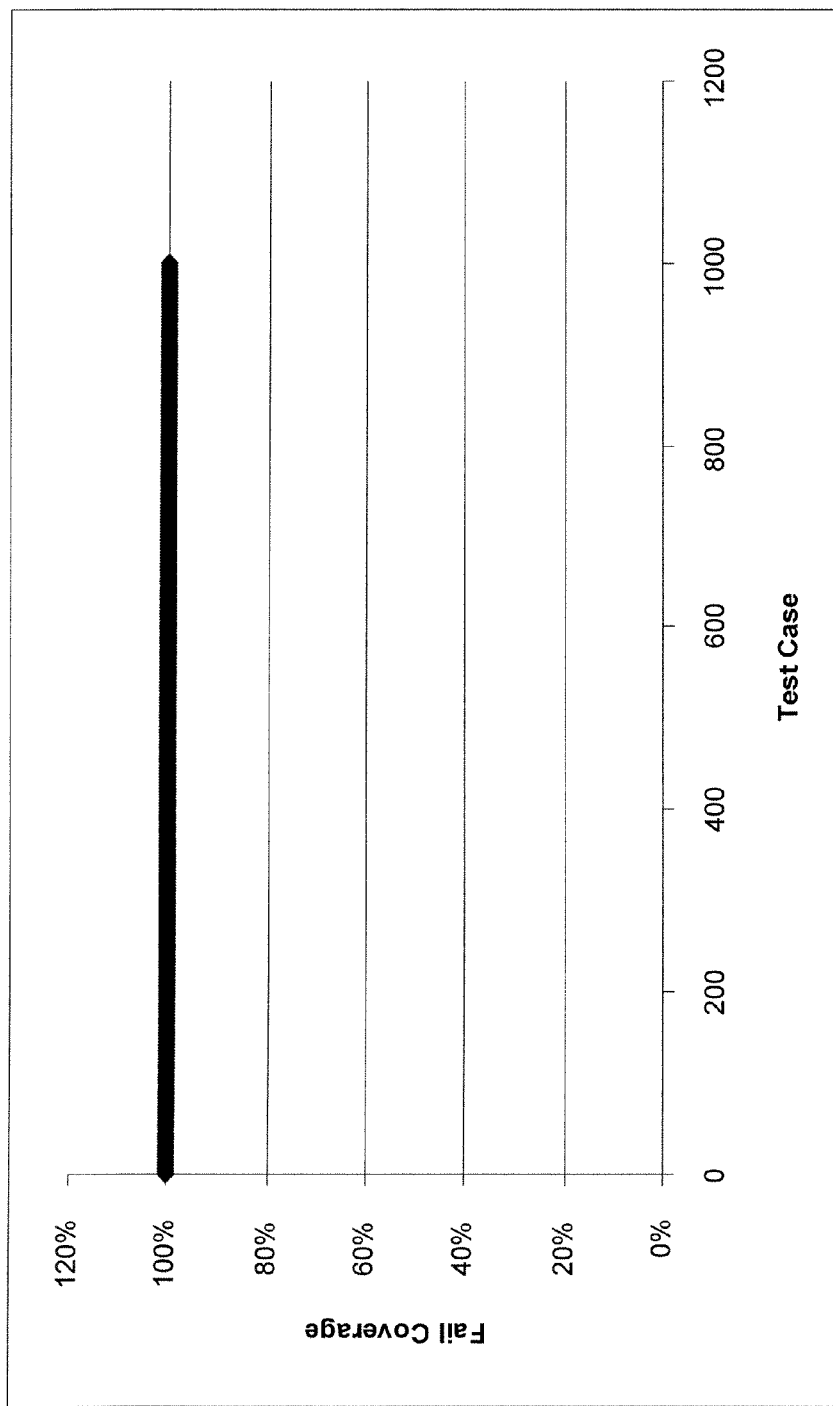
FIG. 34 shows experimental results of using exemplary passing pattern selection methods.

Experimental results of the Simulation Ratio for the circuits IN1, IN2 and IN3 are reported in FIGS. 29, 31 and 33. In these figures, the x-axis shows identification numbers of the test cases, and the y-axis shows the Simulation Ratio. Each point in FIGS. 29, 31 and 33 is the Simulation Ratio for the corresponding test case. The experimental results for the Fail Coverage for the circuits IN1, IN2 and IN3 are reported in FIGS. 30, 32 and 34. In FIGS. 30, 32 and 34, the x-axis shows the identification of the test cases and the y-axis shows the Fail Coverage. Each point in FIGS. 30, 32 and 34 is the Fail Coverage for the corresponding test case.

From FIGS. 29, 31 and 33, it can be observed that the average Simulation Ratios of the circuits IN1, IN2 and IN3 are 17%, 16% and 45% respectively. From FIGS. 30, 32 and 34, it can be observed that the average Fail Coverages for the circuits IN2, IN2 and IN3 are all 100%. Thus, the exemplary method can be effective in selecting passing patterns in designs using multiple clocks such that diagnostic run time is decreased without reducing diagnostic quality.

Further Exemplary Embodiments of Diagnosis Methods Using Dictionaries

Described below are exemplary embodiments of diagnosis techniques which combine effect-cause diagnosis and cause-effect diagnosis. For example, in some embodiments, critical path tracing can be used to effectively handle failing patterns with many failing bits, whereas a pre-computed small dictionary (such as any of the small dictionaries described herein)

can be used to quickly find the initial candidates for failing patterns with a small number of failing bits.

For the purposes of this portion of the application, conventional effect-cause diagnosis is considered to comprise three exemplary phases (although this is an alternate way of viewing effect-cause diagnosis, it does not necessarily describe a different technique than the effect-cause diagnosis technique explained above, for example, with respect to FIG. 2). The phases of conventional effect-cause diagnosis can be described as: performing critical path tracing for a failing pattern p for one or more failing bits to determine an initial candidate set and simulating one or more initial candidates to filter out the candidates which cannot explain p (the first phase); finding a set of candidates (e.g., a small or minimal set of candidates) to explain as many failing patterns as possible by solving a minimum set covering problem (the selected candidates are sometimes called "suspects" and are characterized based on their excitation condition) (the second phase); and simulating one or more suspects for one or more passing patterns, computing scores for one or more suspects based on their failing pattern matches and passing pattern mismatches, and ranking suspects based on their scores (the third phase). In other words, referring back to method 200 of FIG. 2, method act 240 can be considered to be a separate stage or phase of the effect-cause technique.

To demonstrate the performance of the effect-cause diagnosis algorithm, the CPU times of three stages of an effect-cause diagnosis were measured for seven industrial designs. These seven designs are described in Table 5. For each design, the number of gates ($N_{Gate}$), the number of observation points ($N_{ObsPt}$) and the number of test patterns ($N_{pattern}$) are presented. For designs that implement compression techniques (D6 and D7), the compression ratio ($R_{Comp}$) is also reported. The compression ratio is defined as $R_{comp}=N_{Chain}/N_{channel}$, where $N_{Chain}$ is the number of scan chains and $N_{Channel}$ is the number of scan channels. For designs without a compression technique, like D1 to D5, primary outputs and scan flip-flops are treated as observation points, thus $N_{ObsPt}=N_{FF}+N_{PO}$, where $N_{FF}$ is the number of scan flip-flops and $N_{PO}$ is the number of primary outputs. For designs with a compression technique implemented, like D6 and D7, the number of observation points is: $N_{ObsPt}=N_{Channel}*L_{LongestChain}+N_{PO}$, where $L_{LongestChain}$ is the length of the longest scan chain.

TABLE 5

Design information

| Design | D1 | D2 | D3 | D4 | D5 | D6 | D7 |
|---|---|---|---|---|---|---|---|
| $N_{Gate}$ | 314K | 543K | 1.1M | 1.1M | 2.0M | 506K | 1.3M |
| $N_{ObsPt}$ | 20K | 46K | 64K | 70K | 134K | 13K | 8K |
| $N_{Pattern}$ | 5000 | 2252 | 1999 | 9415 | 1000 | 1000 | 1800 |
| $R_{Comp}$ | n/a | n/a | n/a | n/a | n/a | 6.5X | 9.9X |

For each of the circuit designs, the following experiment was performed to measure the CPU time for each stage of the conventional effect-cause diagnosis algorithm introduced above: 100 faillogs were created for each design by simulating randomly selected stuck-at faults. Clock- or chain-related faults were excluded. Then, the effect-cause diagnosis algorithm was used to diagnose all faillogs. CPU time spent on each stage was included in the diagnosis report. After diagnosing all faillogs for a design, diagnosis reports were post-processed to compute the average CPU time for each stage. The CPU time was normalized by dividing by the averaged total CPU time, and the normalized CPU time breakdown is plotted in FIG. 16.

Figure 16:
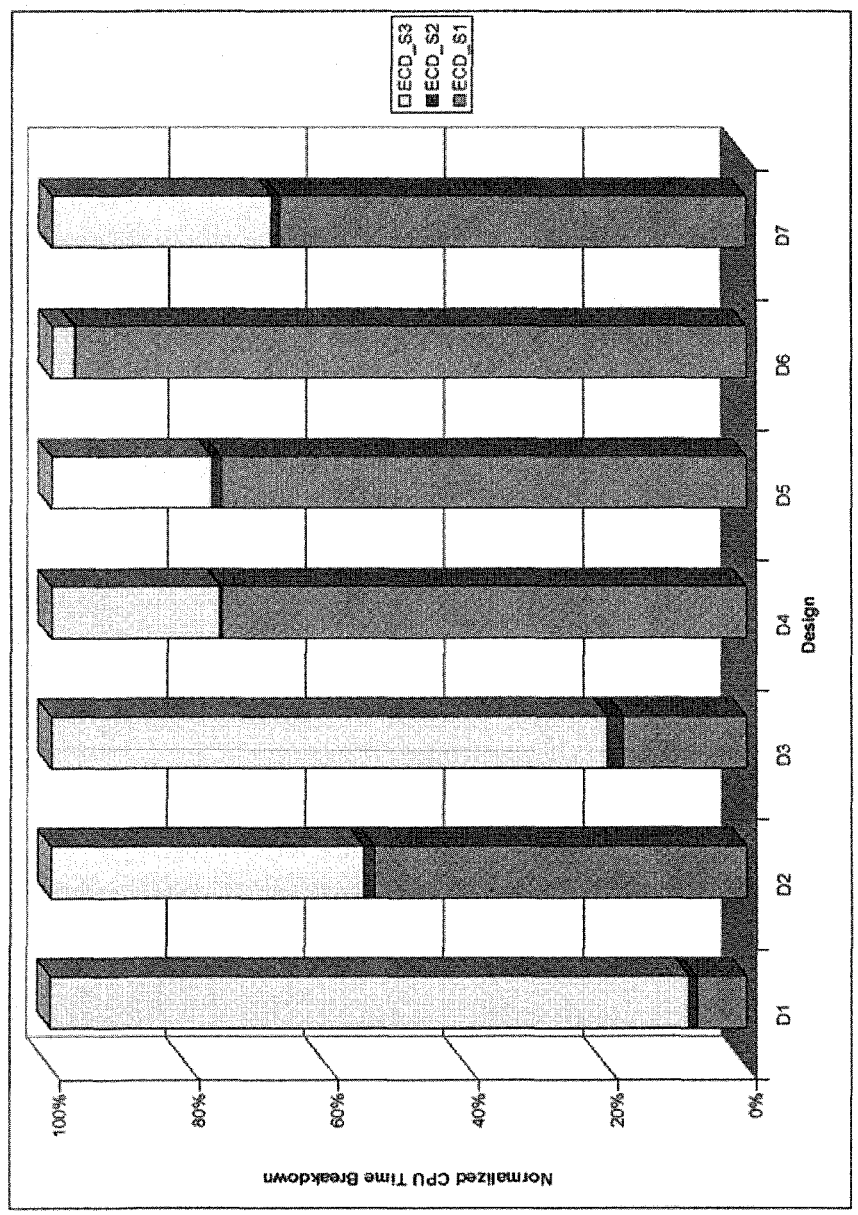
FIG. 16 is a plot of experimental results for the circuits of Table 4 using embodiments of the disclosed technologies.

From FIG. 16, it can be seen that for all tested designs, the second stage of effect-cause diagnosis (indicated by "ECD_S2") required a relatively small amount of CPU time, about 12% of the total CPU time. However, for the other two stages, the CPU time breakdown varied considerably. For D6, more than 96% of CPU time was spent on the first stage (indicated by "ECD_S1"), where the failing patterns were processed. However, for D1, about 92% of CPU time was spent on the third stage (indicated by "ECD_S3"), where the passing patterns were processed. For D2, these two stages each took about 50% of CPU time.

It can be seen that the bottleneck of the effect-cause diagnosis can be highly design-dependent and/or pattern-dependent. Different designs, even with a similar number of test patterns, like D2 and D3, can behave differently. Even for designs with a similar number of gates and a similar number of scan flip-flops, like D3 and D4, the diagnosis bottleneck can be significantly different. For D2 and D6, designs with a similar number of gates, the latter design needed 10 times more CPU time to process one faillog than the former design because of the use of compression techniques, sequential patterns, and clock gaters.

In general, the first stage tends to cost more CPU time if more sequential patterns are used, because it can be more expensive to simulate the sequential pattern for the initial candidate list, which is typically much larger than the final suspect list to be simulated for passing patterns. Also, for designs with compression techniques, the simulation of failing patterns during diagnosis typically uses more computational effort due to the reduced effectiveness of the critical path tracing. For modern large designs, increasingly large numbers of complicated clock-gating structures are used, for example, to reduce the circuit's power consumption. Critical path tracing cannot effectively handle such clock gating schemes and tends to include clock-gating-related faults into the initial candidate list. This can create a large number of events during simulation and slows the simulation. For large designs, compression techniques are often adopted to address the test data volume problem, sequential patterns are used to catch the timing defects and reduce the pattern count, and power consumption can be restrained by various sophisticated clock gating schemes. For such designs, the first stage of the effect-cause diagnosis can be much more time-consuming.

As was also explained above, another possible approach for diagnosing faillogs is cause-effect diagnosis. As previously mentioned, a problem with this approach can be the memory required to store the generated fault dictionary. The size $S_{Full}$ of a full dictionary (storing complete failing information, using a single bit to indicate whether a given fault $F_i$ is detected by a pattern $P_j$ at an observation point $O_k$) in bytes can be calculated as:

$$S_{Full}=N_{SAF}*N_{Pattern}*N_{ObsPt}/8 \quad (6)$$

where $N_{SAF}$ is the total number of collapsed stuck-at faults of this design. As seen in Table 6, even for a relatively small design like D1, 7.9TB of memory is needed. The size $S_{P/F}$ of a pass/fail dictionary (using a single bit to indicate whether a given F1 is detected by a pattern $P_j$) in bytes can be calculated as $S_{P/F}=N_{SAF}*N_{Pattern}/8$.

TABLE 6

Memory overhead of fault dictionaries for the circuits of Table 5

| Design | D1 | D2 | D3 | D4 | D5 | D6 | D7 |
|---|---|---|---|---|---|---|---|
| $N_{Gate}$ | 314K | 543K | 1.1M | 1.1M | 2.0M | 506K | 1.3M |
| $N_{ObsPt}$ | 20K | 46K | 64K | 70K | 134K | 13K | 8K |

TABLE 6-continued

Memory overhead of fault dictionaries for the circuits of Table 5

| Design | D1 | D2 | D3 | D4 | D5 | D6 | D7 |
|---|---|---|---|---|---|---|---|
| $N_{Pattern}$ | 5000 | 2252 | 1999 | 9415 | 1000 | 1000 | 1800 |
| $N_{SAF}$ | 451K | 849K | 1.2M | 1.3M | 2.5M | 478K | 1.8M |
| $S_{Full}$ | 7.9T | 14.3T | 27.2T | 147T | 70.4T | 1.3T | 4.5T |
| $S_{P/F}$ | 394M | 310M | 425M | 2.1G | 525M | 102M | 563M |

Exemplary Embodiments of Additional Small Dictionaries

As explained above, it can be impractical to store the complete failure information for all faults of a design, for example, in a full dictionary. Embodiments of the disclosed dictionaries thus focus on storing failure information that gives the most benefits for improving diagnostic performance. Before introducing additional embodiments of small dictionaries that can be used during fault diagnostics, a discussion of what type of information if desirably stored is provided.

Review of Critical Path Tracing

In method act 220 of the effect-cause diagnosis method 200, a failing pattern p is analyzed using critical path tracing to produce a list of initial fault candidates. In method act 230, these candidates are simulated to determine whether a candidate can explain p. Based on the single-location-at-a-time (SLAT) assumption, the initial candidate list for p is typically identified by critical path tracing. Path tracing can comprise, for one or more failing bits $B_{fail}^j$ of p, finding one or more candidates $C_i^j$ by back tracing critical paths which may explain $B_{fail}^j$. Candidates which may explain one or more failing bits (e.g., all failing bits) of p can be found by computing the intersection of $C_i^j$ as $$C_i = \bigcap_{j=1}^{N_{fb}^i} C_i^j \quad (5)$$

where $N_{fb}^i$ is the total number of failing bits of p. $C_i$ can be returned as initial candidates for further simulation.

Figure 17:
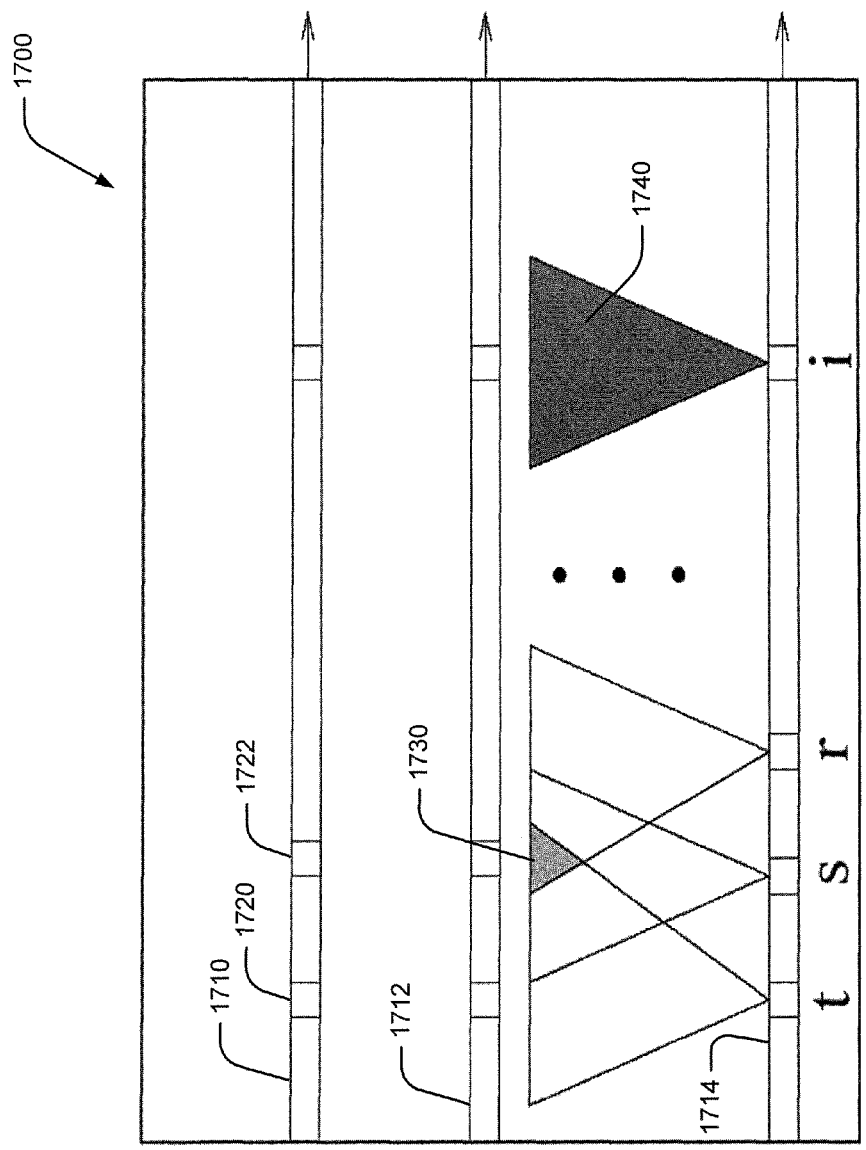
FIG. 17 shows a block diagram of a circuit comprising scan chains.

In some embodiments, critical path tracing can find all candidates which can explain all failing bits of p. One potential problem is that some faults with a large number of failing bits under p, which is a superset of failing bits of p, will also be included in $C_i$. Such a fault can sometimes trigger many events during simulation, and thus slow the diagnosis process. This behavior can become more serious when $N_{fb}^i$ is small, and is illustrated in FIG. 17 for a circuit design 1700 with no compactor. The design 1700 comprises scan chains 1710, 1712, 1714, which are comprised of scan cells (e.g., scan cells 1720, 1722). In one example, a failing pattern $p_1$ has 3 failing bits stored in cells of the scan chain 1714 corresponding to cycles r, s, t. The candidate list for each failing bit could be large, but the final candidate list after determining an intersection (which is within the region 1730) can be reduced considerably. However, if P2 has only a single failing bit (in, for example, cell i of the scan chain 1714), candidates from the entire input cone of cell i (within region 1740) should be simulated.

Figure 18:
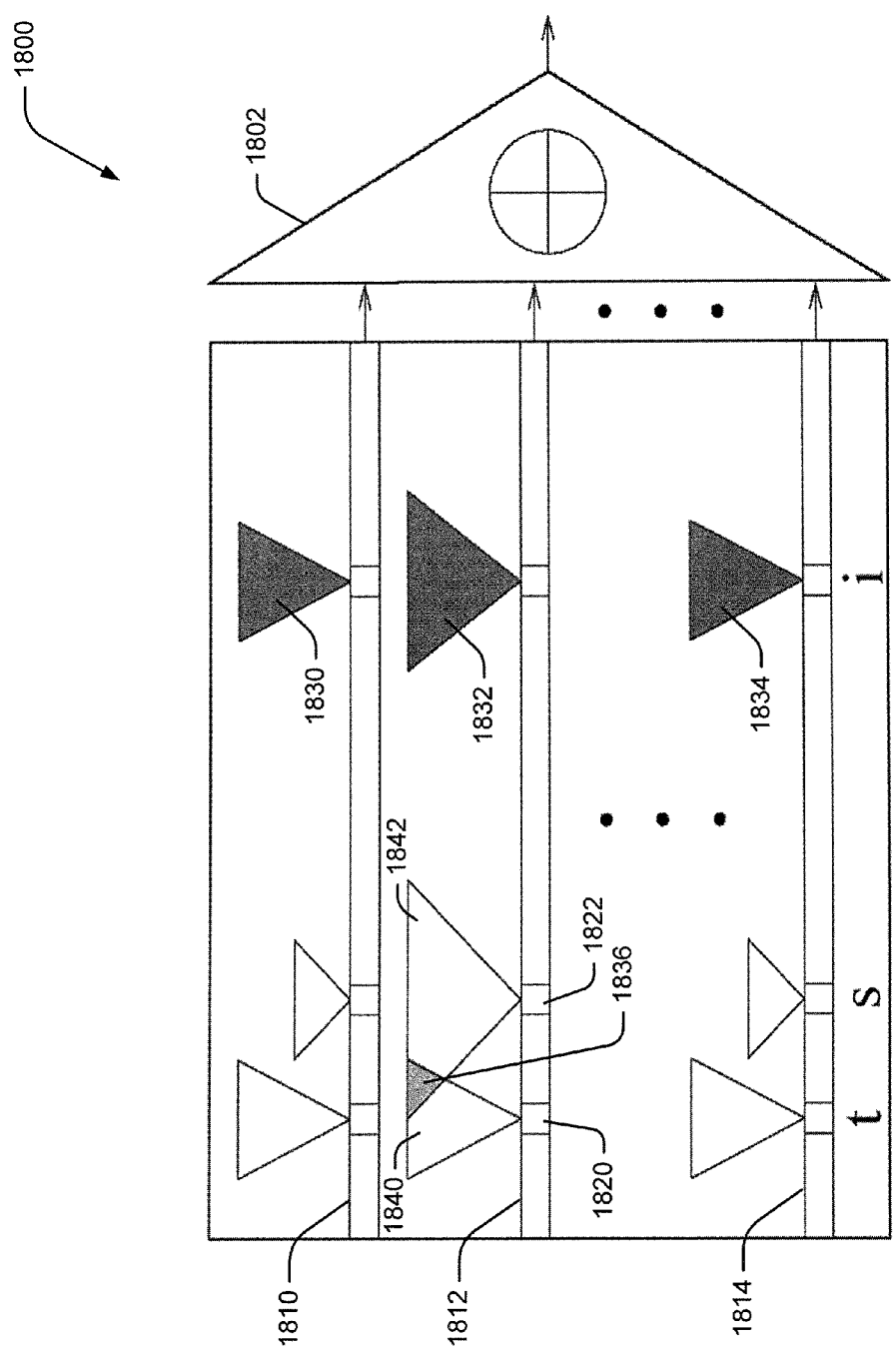
FIG. 18 shows a block diagram of a circuit comprising scan chains and a compactor.

This problem can become worse when direct diagnosis is applied to a design with a compactor. For example, FIG. 18 shows a block diagram of an exemplary circuit 1800 comprising a compactor 1802 and a plurality of scan chains 1810, 1812, 1814. The scan chains comprise respective scan cells, such as scan cells 1820, 1822. In the depicted embodiment, the compactor 1802 is an N-to-1 space compactor. For a failing pattern $p_1$, a single failing bit is observed at cycle i at the compactor output. Since it is not known which chain this failing bit comes from during the direct diagnosis, most or all candidates which may explain cell i from any chain under this pattern are typically simulated. As can be seen in FIG. 18, the candidate list derived from the union of input cones 1830, 1832, 1834 of cell i for all chains could be very large, especially when the compactor 1802 provide a high compression ratio (N>>1). However, the intersection can still effectively reduce the initial candidate list if more than one failing bit is available. Assuming, for example, that P2 has two failing bits during cycles s and t at the compactor output, then the candidate list determined by the intersection of logic cones 1840, 1842 is relatively small (e.g., within the region 1836).

Real Faillog Profile

Figure 19:
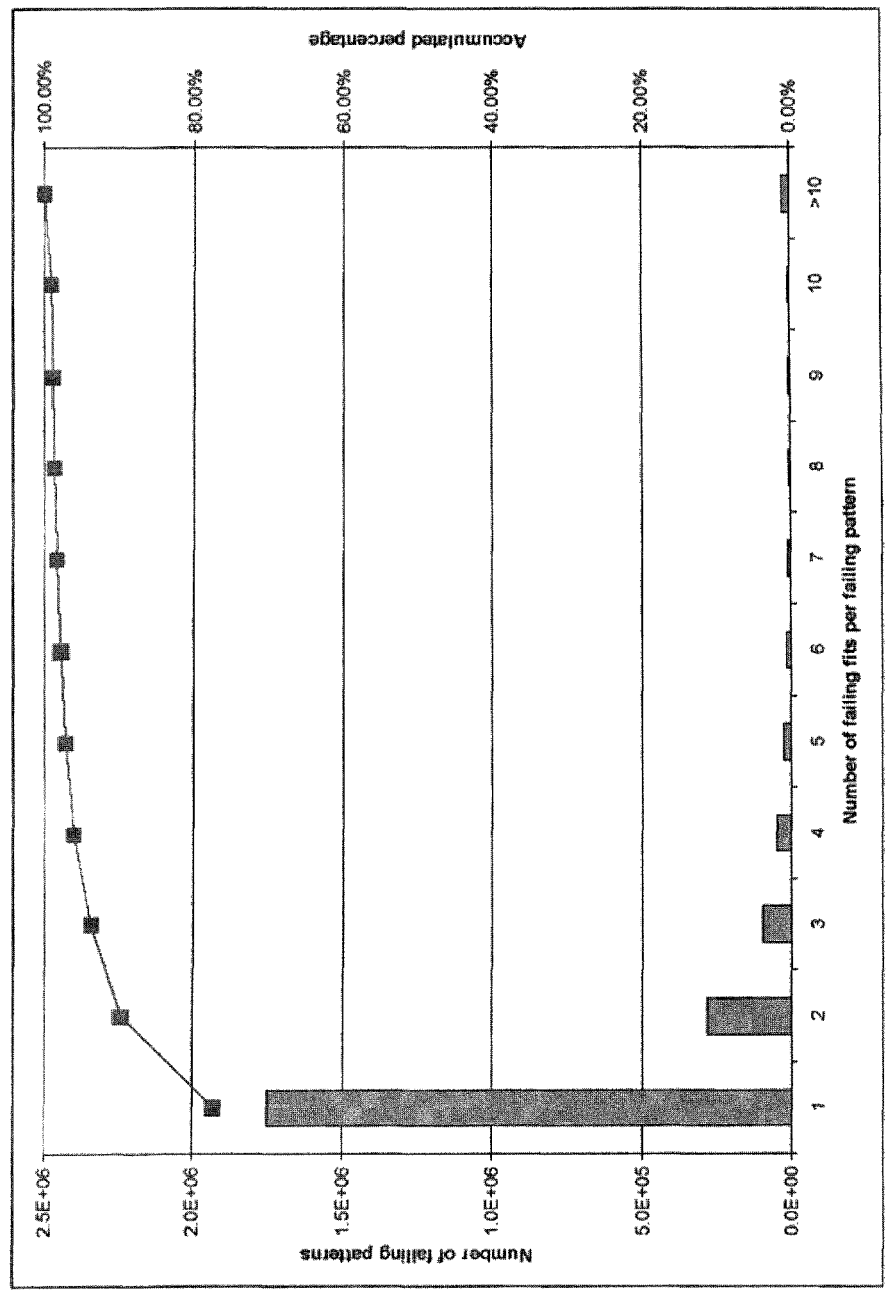
FIG. 19 describes results of an examination of faillogs.

An experiment was performed to understand the profile of the number of failing bits per failing pattern. Using design D5, more than 20,000 faillogs from actual silicon die were profiled and plotted in FIG. 19. For this experiment, failing patterns were grouped based on the number of failing bits, and the number of failing patterns for each group was counted and displayed as bars in FIG. 19. The curve shows the accumulated percentage of failing patterns which have no more than a given number of failing bits. As shown in FIG. 19, 77% of failing patterns have only one failing bit, 12% of failing patterns have only two failing bits, and 97% failing patterns have only 5 failing bits or less. Such a high percentage of failing patterns with a small number of failing bits can reduce the effectiveness of the critical path tracing, generate a large list of candidates to be simulated, and thus slow the diagnosis process.

$N_{FB}$ Dictionary

A further embodiment of a small fault dictionary can be used to effectively address at least some issues described above. For instance, in some embodiments, a fault dictionary can be used to store some or all unique failing patterns for a fault with some threshold number of failing bits ($N_{FB}$) or less. The resulting dictionary is referred to herein as an "$N_{FB}$ dictionary."

Figure 20:
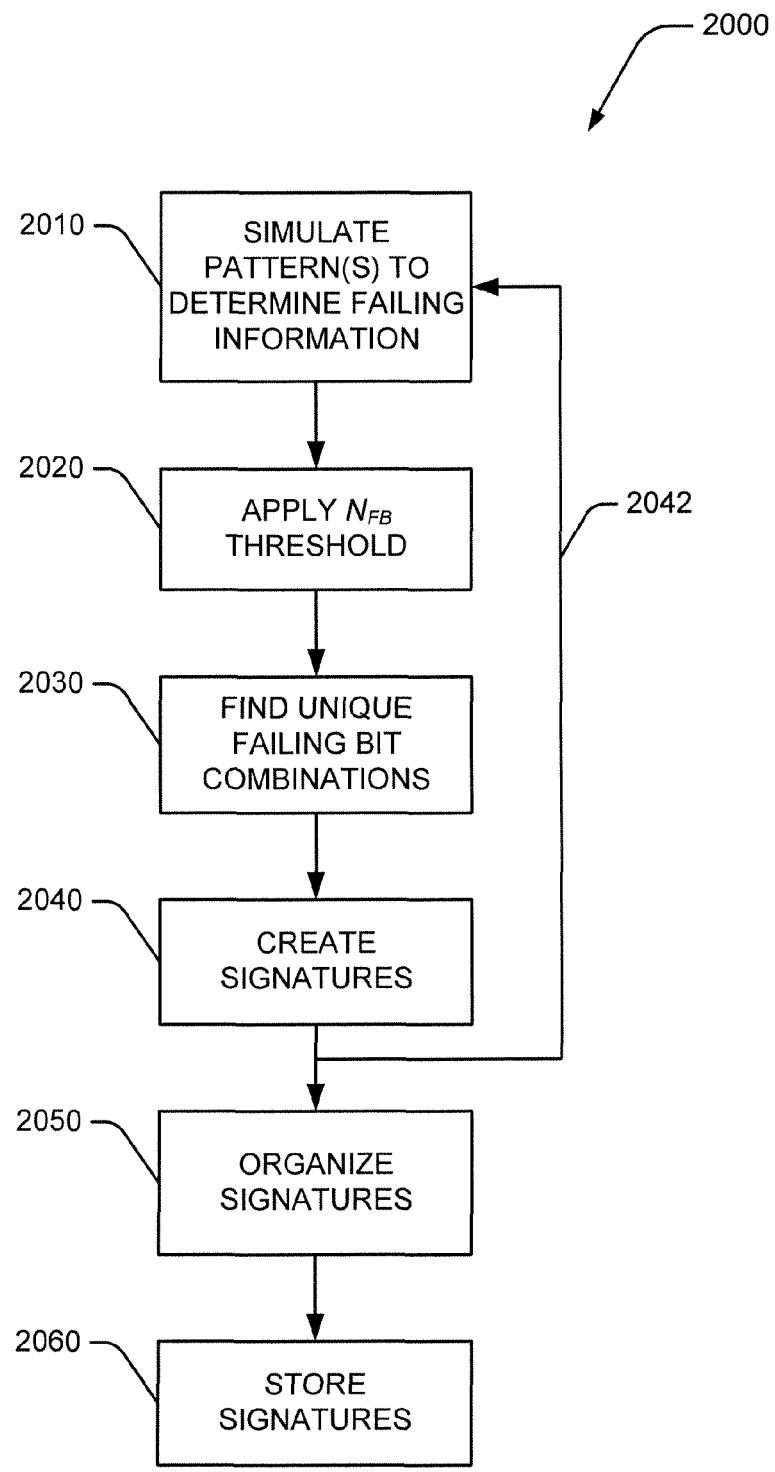
FIG. 20 is a block diagram of an exemplary embodiment of a method of making an $N_{FB}$ dictionary.

When analyzing a failing pattern p with no more than $N_{FB}$ failing bits, a lookup of the pre-computed $N_{FB}$ dictionary can be used to quickly find at least some members of an initial candidate list for p, instead of using the critical path tracing for every member. The $N_{FB}$ dictionary can be constructed during a preprocessing period. FIG. 20 shows an exemplary embodiment of a method 2000 for creating an $N_{FB}$ dictionary. In method act 2010, one or more patterns are simulated to determine failing information for a fault f (e.g., to identify one or more failing patterns to create a pattern candidate set). In method act 2020, a threshold of $N_{FB}$ failing bits is applied to the patterns, and patterns with more than $N_{FB}$ failing bits are removed from the pattern candidate set. In method act 2030, one or more unique failing bit combinations are identified among one or more remaining failing patterns for f. A unique failing bit combination is a test response that comprises one or more failing bits indicative of the presence of the fault f and is not identical to a previously identified test response. In method act 2040, signatures can be created from one or more of the unique failing bit combinations (e.g., using a compactor) and stored in one or more computer-readable media (method act 2060). One or more of the method acts 2010, 2020, 2030 and 2040 can be repeated for one or more additional faults, as indicated by arrow 2042. In further embodiments, the signatures can be organized such that they can be efficiently queried. Because only the unique signatures for failing patterns with no more than $N_{FB}$ failing bits are stored in this exemplary embodiment, the memory requirements can be dramatically reduced, which can make the $N_{FB}$ dictionary applicable for circuit designs of various sizes, even large industrial designs.

Fault Grouping

Figure 21:
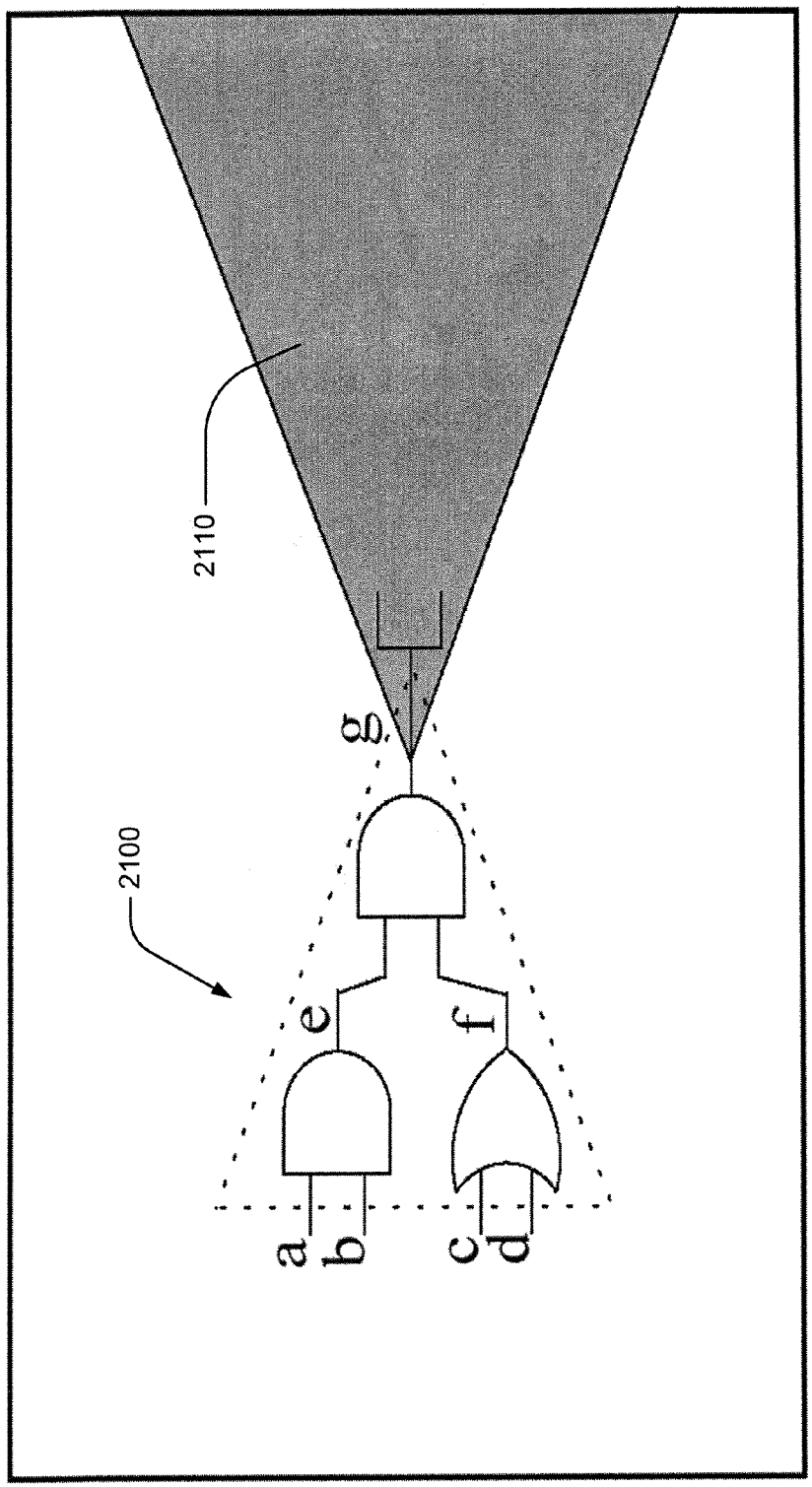
FIG. 21 shows a block diagram of an exemplary circuit with a fanout-free region.

One technique that can be used in some embodiments of the disclosed technology to reduce the memory usage of an $N_{FB}$ dictionary involves fault grouping. For example, consider a simple fanout-free region (FFR) 2110 is depicted in conjunction with circuit 2100 in FIG. 21. For purposes of this example, it is assumed that the unique signatures of all collapsed stuck-at faults within the FFR 2110 are as listed in Table 7. In the depicted embodiment, a total of 21 entries are required to store the unique signatures for all 8 faults.

TABLE 7

An example of unique signatures resulting from eight faults

| Fault | Unique signatures |
|---|---|
| a/1 | $s_1, s_3$ |
| b/1 | $s_1, s_5$ |
| c/0 | $s_2, s_3$ |
| d/0 | $s_3, s_4$ |
| e/1 | $s_1, s_3, s_5$ |
| f/1 | $s_1, s_2$ |
| g/0 | $s_2, s_3, s_4, s_5$ |
| g/1 | $s_1, s_2, s_3, s_5$ |

For combinational patterns, when a fault within a FFR is detected, for example, fault a stuck-at-1 (a/1) is detected by a pattern p as a signature $s_3$, some downstream faults with the suitable polarity, such as e/1 and g/1, will also be detected by p as the signature $s_3$. Therefore, in some embodiments two or more unique signatures can be shared among two or more faults. For example, signature $s_3$ is shared by five faults: a/1, c/0, d/0, e/1 and g/0. In some embodiments, faults which share one or more signatures can be grouped together. This can further reduce the memory requirements of the $N_{FB}$ dictionary. For example, the shared signatures can be stored once for the whole fault group, rather than multiple times for multiple individual faults. For the example shown in Table 7, if all 8 faults are considered as a group, only 5 data entries are needed for all 5 unique signatures for this whole fault group, instead of the 21 data entries required without fault grouping. Table 8 shows the signatures of Table 7 associated with a single fault group:

TABLE 8

An example of fault grouping

| Fault Group | Unique signatures |
|---|---|
| a/1, b/1, c/0, d/0, e/1, f/1, g/0, g/1 | $s_1, s_2, s_3, s_4, s_5$ |

In particular embodiments, a potential result of this technique is that a large initial candidate list is returned by the dictionary query, which can increase the diagnosis time. For example, in the circuit described by Table 7, for a failing pattern with signature $S_5$, only 4 faults (b/1, e/1, g/0 and g/1) of this FFR are returned as candidates by querying the $N_{FB}$ dictionary without the fault grouping. However, in some embodiments, all 8 faults are included as candidates if the fault grouping is used to create the fault dictionary. A potential performance impact of this embodiment is examined below. Although grouping faults based on FFRs can be a straight-forward way to group faults, further embodiments can be used. Other more sophisticated fault grouping methods can also be used to further reduce the size of the fault dictionary (for example, a small or minimal covering algorithm, fault grouping based on clusters of fanout-free regions, and other such methods).

Exemplary Embodiments of Diagnostic Procedures Using $N_{FB}$ Dictionaries

Figure 22:
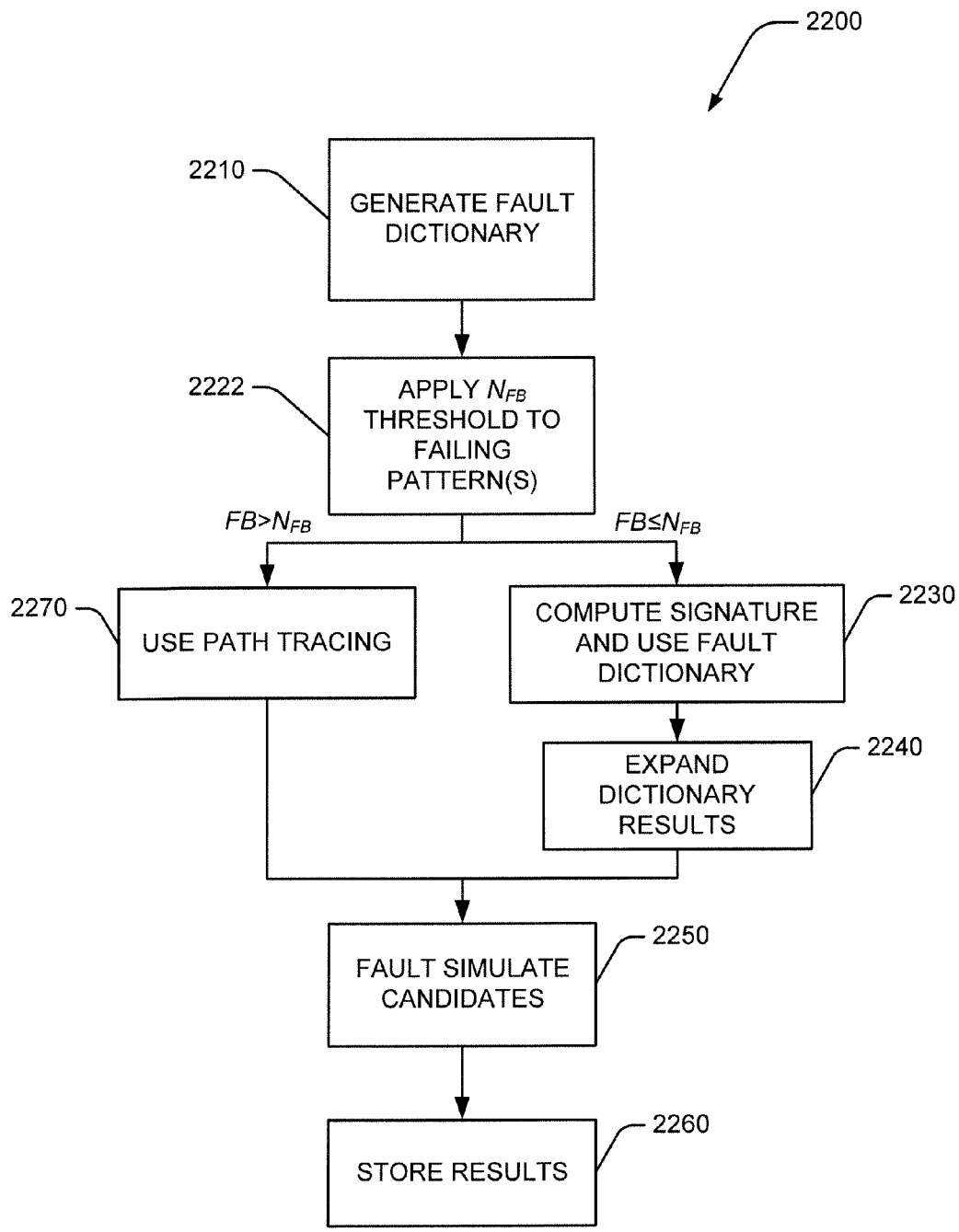
FIG. 22 shows one embodiment of an exemplary method of using an $N_{FB}$ dictionary for fault diagnosis.

FIG. 22 shows one embodiment of an exemplary method 2200 of using an $N_{FB}$ dictionary for fault diagnosis. In method act 2210 a fault dictionary is created (e.g., using the method 2000). In embodiments where a fault grouping technique is used, unique signatures for one or more fault groups, instead of for one or more faults, can be identified and stored. In method act 2222, one or more failing patterns p are examined to determine if the one or more patterns contain more than a threshold of failing bits (e.g., more than $N_{FB}$ failing bits). For particular embodiments, the threshold can be, for example, 1, 2, 3, 4, 5 . . . 10 or more failing bits per pattern. In some embodiments, the one or more failing patterns are loaded from a faillog. In method act 2230, for failing patterns having no more than the threshold of failing bits, one or more respective pattern signatures are determined (e.g., using a compactor or compactor simulation) and the $N_{FB}$ dictionary can be queried using the one or more signatures. In some embodiments where fault grouping is used, one or more query results are "expanded" in method act 2040 to list a plurality of initial fault candidates associated with one or more signatures. In some embodiments where fault grouping is not used, some or all of the query results can be used directly as initial fault candidates. In additional embodiments, if a query of the $N_{FB}$ dictionary returns no results, the failing pattern can be considered unexplained and can be ignored. In method act 2250, one or more initial fault candidates are fault simulated, and in method act 2260 results of the simulation are stored in one or more computer-readable media.

In further embodiments, if the results of method act 2220 indicate that a given failing pattern p comprises more than the threshold number of failing bits, critical path tracing can be used in method act 2270 to create an initial candidate list.

Generally, as both the critical path tracing of method act 2270 and the $N_{FB}$ dictionary querying of method act 2230 can return a list of initial candidates which is a superset of the real suspects, diagnosis accuracy and resolution are generally not compromised by using method 2200. In at least some embodiments, the same results as the conventional effect-cause diagnosis can be produced by the method 2200. In addition, some embodiments of the $N_{FB}$ dictionary can, for a given circuit, address the majority of failing patterns with a small number of failing bits and can achieve a performance improvement with a relatively small (or minimal) memory overhead.

Experimental Results

Various experiments were performed on industrial circuit designs using technologies described herein. Results of the experiments are presented below.

Memory Overhead

Figure 23:
FIG. 23 shows experimental results examining the effects of example $N_{FB}$ dictionaries on memory overhead.

The memory overhead for an exemplary embodiment of the $N_{FB}$ dictionary was first investigated. Experiments were performed on the seven industrial designs listed in Table 4. The first experiment measured the memory overhead of an $N_{FB}$ dictionary without fault grouping. For each design, the memory usage of the conventional effect-cause diagnosis (e.g., as shown in FIG. 2) was used as the baseline. The extra memory used to load the dictionary was considered memory overhead. The $N_{FB}$ dictionary memory overhead was normalized by dividing the memory usage before loading the dictionary and plotted in FIG. 23. Experiments were repeated for four different values of $N_{FB}$ (2 bits, 5 bits, 10 bits, 100 bits), with results for each of the values represented by different columns in FIG. 23. The columns in FIG. 23 labeled "Allbit" refer to cases where all unique signatures for every fault in the circuit were stored in the fault dictionary. As can be seen, the exemplary $N_{FB}$ dictionary can significantly reduce the memory overhead compared to the fault dictionary storing all signatures, and thus can be useful in modern large designs. For example, for D5, if only signatures for the failing patterns with no more than 2 failing bits are stored, the memory overhead is less than 2% of the total memory needed to load the design and the pattern set. Compared to storing all signatures, the overhead is about 7 times smaller. If a value of $N_{FB}=5$ is used, the average memory overhead is still as low as 6.4%.

Figure 24:
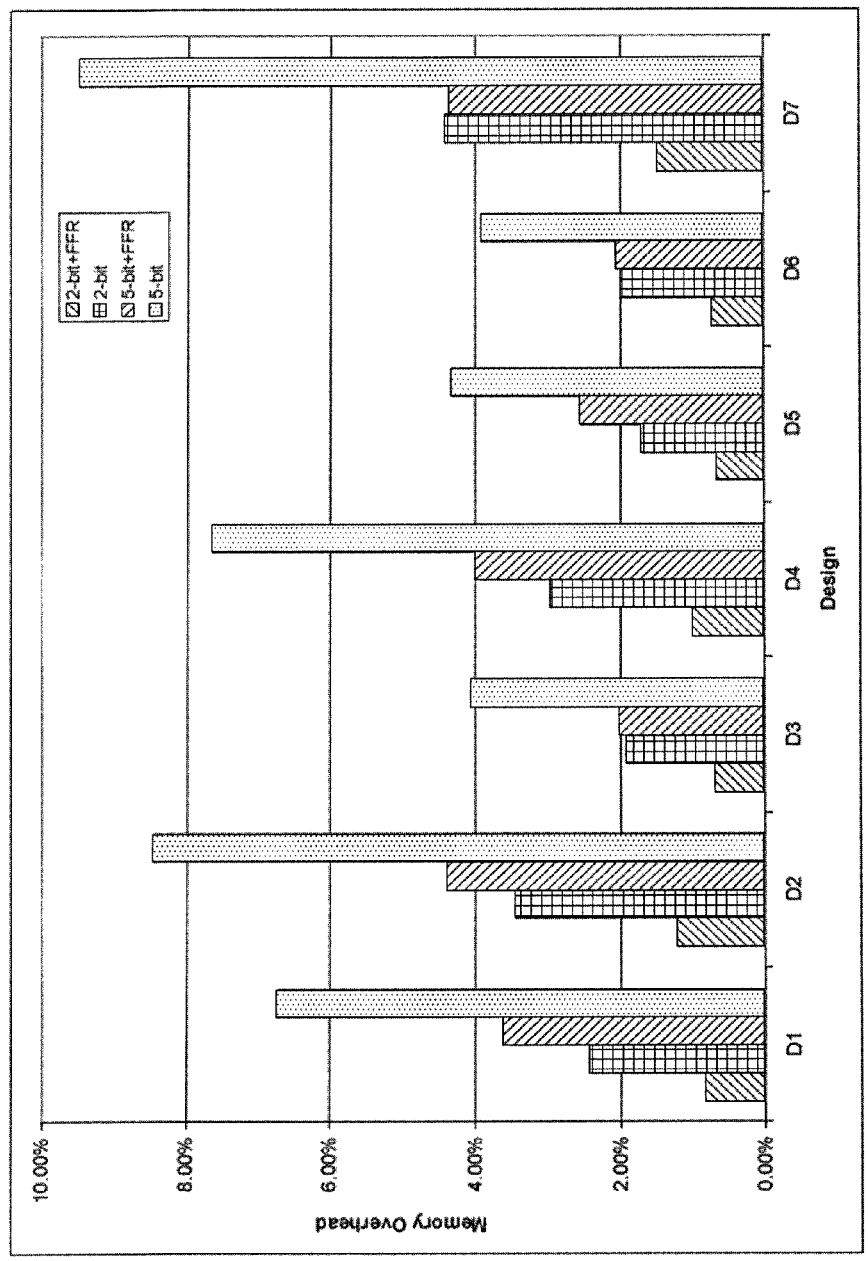
FIG. 24 shows experimental results examining the effects of example $N_{FB}$ dictionaries on memory overhead.

Another experiment was performed to investigate the effectiveness of an embodiment of the disclosed fault grouping technique. Similar to the previous experiment, the memory overhead for an exemplary embodiment of the $N_{FB}$ dictionary with fault grouping based on fanout-free regions was measured. The normalized results are plotted in FIG. 24 as N-bit+FFR. For easy comparison, results for the dictionary without fault group are also shown and are labeled as N-bit. The data for two typical values, $N_{FB}=2$ and $N_{FB}=5$, are presented in FIG. 24.

It can be seen that the exemplary embodiment, with faults grouped based on FFRs, can effectively reduce the memory overhead of the $N_{FB}$ dictionary. For example, for design D7, the fault grouping based on FFRs can reduce the memory overhead of $N_{FB}=5$ dictionary from about 9.5% down to about 4.4% of the total memory needed to load the design and the patterns, which is even smaller than the original $N_{FB}=2$ dictionary without the fault grouping. On average, according to the results shown in FIG. 24, the fault grouping can reduce the memory overhead of the $N_{FB}$ dictionary by 65.0% for $N_{FB}=2$ and by 48.5% for $N_{FB}=5$. In addition, the average memory overhead of $N_{FB}=5$ dictionaries with fault grouping based on FFRs is only 3.3% of the total memory to load design and patterns, and thus this memory overhead may not be an issue, even for large industrial designs. In cases where (for example) the memory budget is tight, the $N_{FB}=2$ dictionary with fault grouping can be used, where average memory overhead is less than 1%. In at least some cases this can be considered almost negligible.

Performance Speedup

Experiments were also performed to examine the performance improvement of exemplary embodiments of the disclosed diagnosis techniques that combine the effect-cause diagnosis with the $N_{FB}$ fault dictionary. For each design listed in Table 4, 100 faillogs were created by simulating randomly selected stuck-at faults. Clock- or chain-related faults were excluded. A conventional effect-cause diagnosis algorithm was applied on all faillogs, and the results were used as a baseline for comparison. The same set of faillogs was also diagnosed by embodiments of the diagnosis technique using the $N_{FB}$ fault dictionary with or without the fault grouping technique. For each diagnosis run, the number of events triggered and the CPU time used for simulating failing patterns were used to measure the diagnosis performance.

Figure 25:
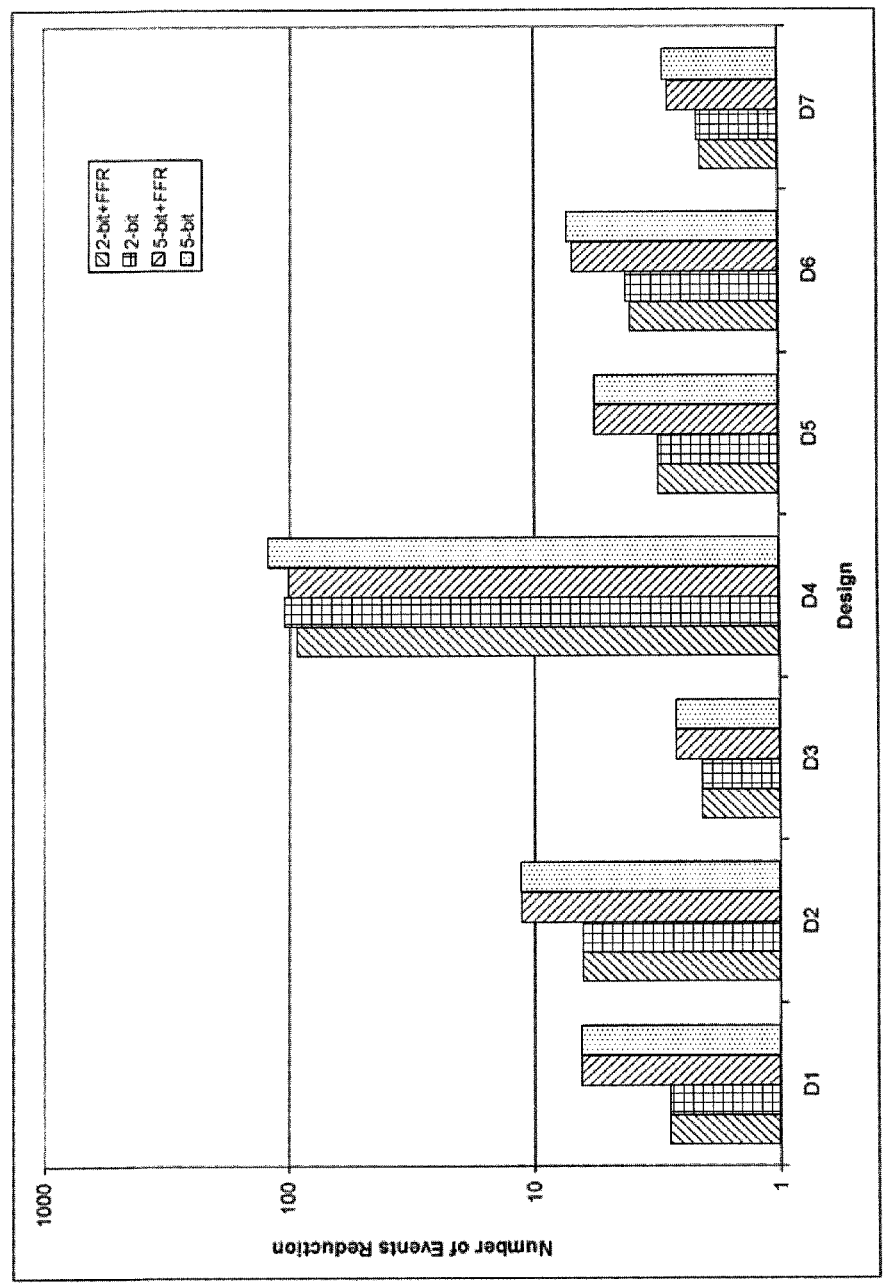
FIG. 25 shows experimental results examining the effects of example $N_{FB}$ dictionaries on the numbers of events triggered in simulations of failing patterns.

The reduction of the number of events triggered during simulating failing patterns will first be considered. For each design, the average number of events was computed over 100 diagnosed faillogs. The factor by which the number of events was reduced was computed by dividing the average number of events for the conventional effect-cause diagnosis by the number for the $N_{FB}$ dictionary methods described above (with and without fault grouping based on FFRs), and plotted in FIG. 25. It can be seen that the total number of events triggered during simulation of failing patterns can be reduced by using the disclosed methods. For design D4, using the $N_{FB}$ dictionary can reduce the number of events by about 100×, and thus improve the diagnosis performance. On average, a 16.1×~22.7× reduction in the number of events was achieved by four different dictionaries.

Figure 26:
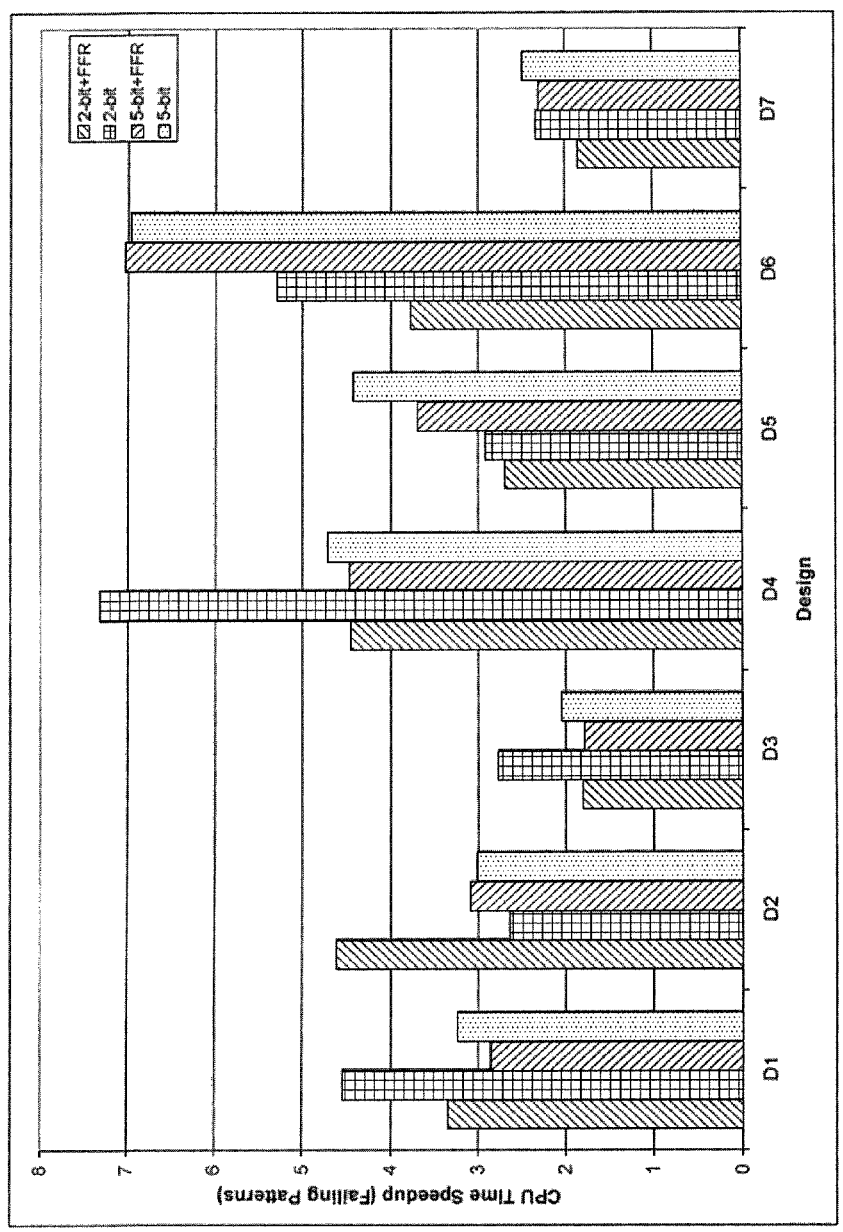
FIG. 26 shows experimental results examining the effects of example $N_{FB}$ dictionaries on CPU processing time.

Additionally, embodiments of the disclosed fault grouping technique based on FFRs can have an impact on reducing the number of events. For example, the average reduction was 16.1× for the $N_{FB}=2$ dictionary with the fault grouping, and the average reduction for the $N_{FB}=2$ dictionary without the fault grouping was 17.8×. These values are relatively close because the extra candidates introduced by the fault grouping technique typically have a local effect and can be quickly dropped during simulation. Therefore, there is often no significant impact on the reduction of the number of events. The speedup of CPU time for processing failing patterns was also investigated. The average CPU time to analyze all failing patterns for a faillog was computed for all 100 faillogs for each design. The speedups for each run were computed by dividing the average CPU time of the conventional effect-cause algorithm by the time of this run. The speedups are presented in FIG. 26, which shows experimental results for four exemplary $N_{FB}$ dictionaries. As can be seen, a performance improvement can be achieved by the disclosed method. On the average, a 3.2×~4.0× speedup was achieved by different runs for these seven designs. For design D6, a 7× speedup was achieved using an embodiment of the disclosed method with $N_{FB}=5$ dictionaries, either with or without fault grouping. In addition, it can be seen that the $N_{FB}=5$ dictionary with fault grouping had a similar speedup as the dictionary without fault grouping, but a smaller memory overhead. In some cases, this can be a preferred tradeoff.

Exemplary Computer Networks

Figure 27:
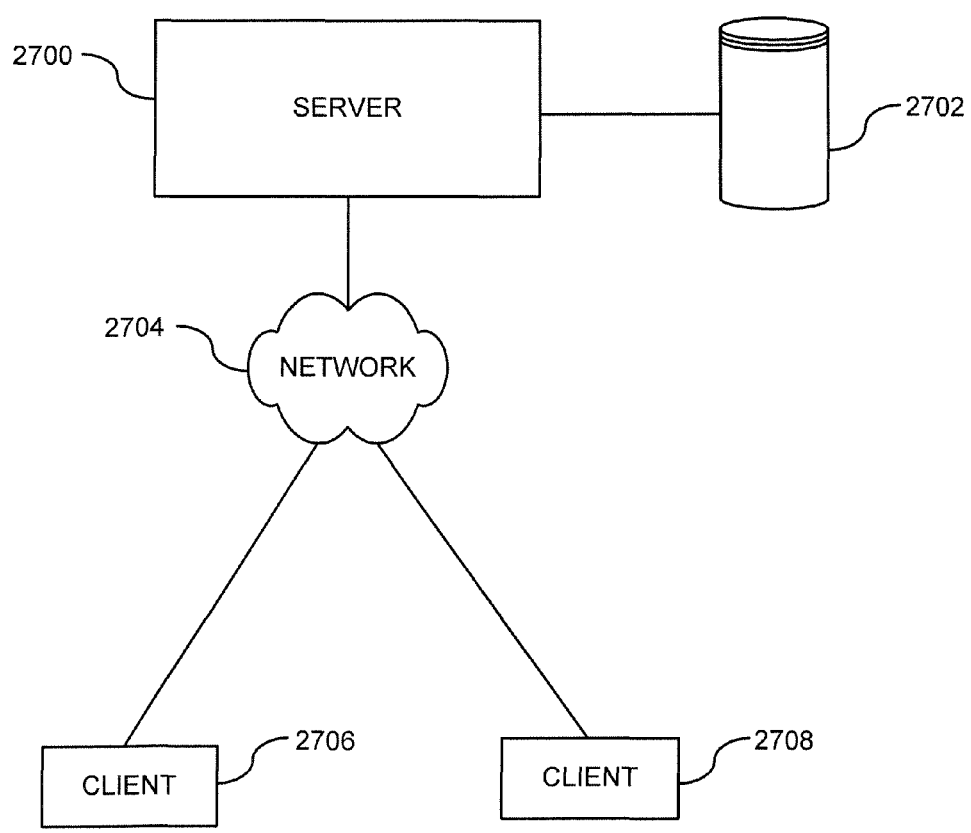
FIG. 27 is a block diagram of an exemplary distributed computer network that can be used with one or more technologies described herein.

Any of the aspects of the technologies described above can be performed using a distributed computer network. FIG. 27 shows one such exemplary network. A server computer 2700 can have an associated storage device 2702 (internal or external to the server computer). For example, the server computer 2700 can be configured to perform a fault diagnosis technique according to any of the disclosed embodiments (e.g., as part of an EDA software tool). The server computer 2700 can be coupled to a network, shown generally at 2704, which can comprise, for example, a wide-area network, a local-area network, a client-server network, the Internet, or other such network. One or more client computers, such as those shown at 2706, 2708, may be coupled to the network 2704 using a network protocol.

Figure 28:
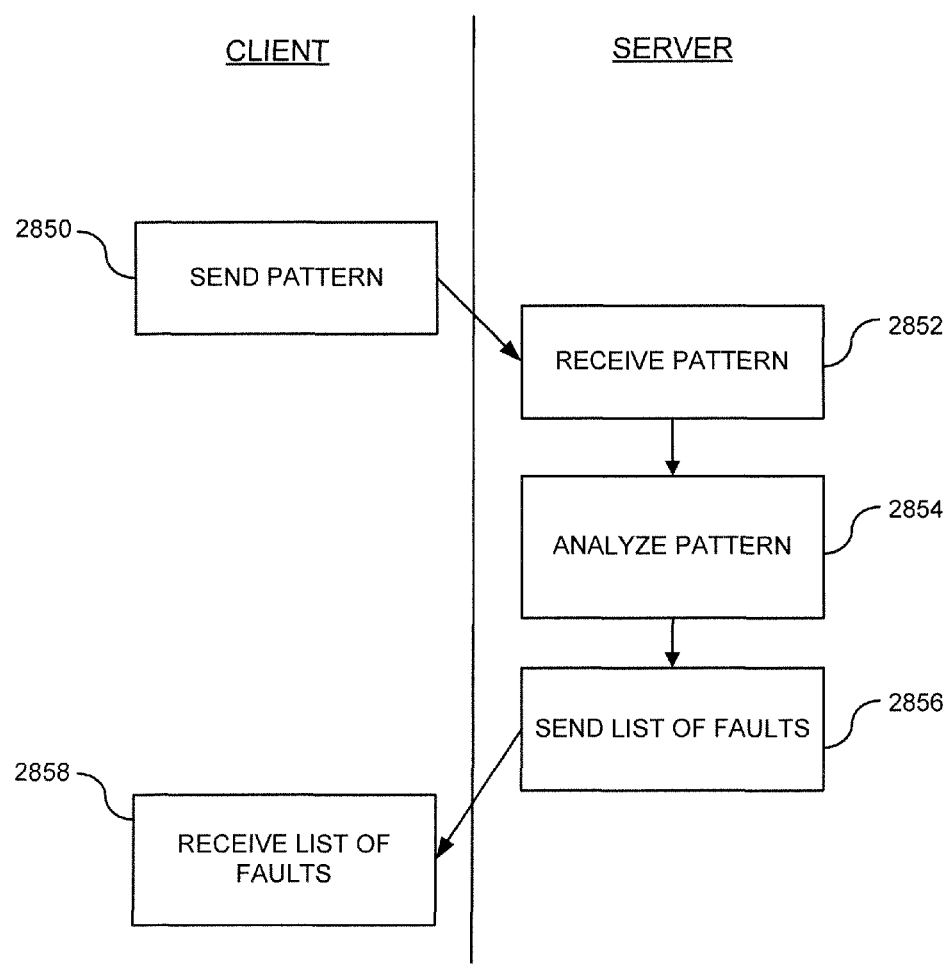
FIG. 28 is a block diagram of an exemplary method of using the network of FIG. 27 to diagnose one or more faults in an electronic circuit.

FIG. 28 shows one exemplary manner in which the distributed network shown in FIG. 27 can operate to diagnose one or more faults in an electronic circuit. In particular, a failing test pattern from a circuit-under-test can be analyzed according to any of the embodiments disclosed herein using a remote server computer, such as the server computer 2700 shown in FIG. 27. In method act 2850, for example, the client computer sends a failing pattern (obtained from ATE on a production floor, for example). In method act 2852, the pattern is received and loaded by the server computer. In method act 2854, the pattern is analyzed using a diagnostic procedure according to any of the disclosed embodiments. A list of faults identified by the diagnostic procedure can be created. The list of faults can be stored as one or more separate files or data structures. In method act 2856, the server computer sends the list of faults to the client computer, which receives the diagnostic results in method act 2858. Note that this procedure can occur as the list of faults is being created or very shortly after the list of faults is created (while the circuit-under-test is still coupled to the tester, for example). Thus, the diagnostic procedure can be performed on-line.

It should be apparent to those skilled in the art that the example shown in FIG. 28 is not the only way to perform diagnostics according to the disclosed technology. For instance, the pattern to be analyzed may be stored on a computer-readable medium that is not on a network and that is sent separately to the server (e.g., on a CD-ROM or other computer-readable medium). Moreover, the server computer may perform only a portion of the diagnostic procedure.

In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims. We therefore claim as our invention all that comes within the scope and spirit of these claims.

We claim:

1. A method of diagnosing defects in an electronic circuit, the method comprising:
   determining a set of one or more fault candidates for the electronic circuit for a set of failing test patterns by using a fault dictionary that describes responses of one or more modeled faults to the failing test patterns;
   after determining the set of one or more fault candidates, simulating one or more fault candidates of the determined set using both failing and passing test patterns, wherein only a subset of the total passing test patterns is used during the simulating; and
   storing the one or more fault candidates and results of the simulating on one or more non-transitory computer-readable storage media.

2. The method of claim 1, further comprising:
   ranking the one or more fault candidates based at least in part on results of the simulating; and
   storing the results of the ranking on the one or more non-transitory computer-readable storage media.

3. The method of claim 1, wherein the fault dictionary comprises one or more entries identifying one or more fault candidates and identifying one or more clocks that are associated with scan cells that capture failing bits caused by the one or more fault candidates.

4. The method of claim 1, wherein the fault dictionary comprises information associating one or more circuit clock signals with the one or more fault candidates.

5. The method of claim 1, wherein the fault dictionary comprises one or more entries indicating possible signatures produced by one or more of the failing test patterns.

6. The method of claim 1, wherein the one or more fault candidates for the electronic circuit determined using the fault dictionary are a first portion of the set of one or more fault candidates, the method further comprising determining a second portion of the set of one or more fault candidates using path tracing.

7. The method of claim 1, wherein the determining the set of one or more fault candidates for the electronic circuit for the set of failing test patterns by using the fault dictionary comprises searching the fault dictionary for a compressed signature associated with at least one of the one or more modeled faults.

8. The method of claim 1, wherein the fault dictionary that describes responses of the one or more modeled faults to the failing test patterns is generated according to a fault dictionary generating method, the fault dictionary generating method comprising:
   for a selected fault,
   simulating one or more test patterns being applied to the electronic circuit in the presence of the selected fault;
   determining test responses to the one or more test patterns that indicate the presence of the selected fault using the simulation; and
   storing, on the one or more computer-readable storage media, a fault dictionary entry that identifies the selected fault and identifies the test responses that indicate the presence of the selected fault.

9. The method of claim 1, wherein the fault dictionary that describes responses of the one or more modeled faults to the failing test patterns is generated according to a fault dictionary generating method, the fault dictionary generating method comprising:
   determining, for a selected fault, that a first test pattern and a second test pattern detect the selected fault and produce a same respective signature; and
   storing on the one or more non-transitory computer-readable storage media one fault dictionary entry for the first and second failing test patterns.

10. The method of claim 9, wherein the approximate size of the fault dictionary corresponds to a size of a signature, a number of faults in the electronic circuit detectable by the one or more failing test patterns, an average number of unique signatures for faults, and a number of clocks in the electronic circuit.

11. The method of claim 9, wherein determining, for a selected fault, that a first test pattern and a second test pattern detect the selected fault and produce a same respective signature comprises compacting test results from the first test pattern and the second test pattern.

12. The method of claim 9, wherein determining, for a selected fault, that a first test pattern and a second test pattern detect the selected fault and produce a same respective signature comprises compacting test results of the one or more failing test patterns in a simulated multiple-input shift register.

13. The method of claim 1, wherein the fault dictionary that describes responses of the one or more modeled faults to the failing test patterns is generated according to a fault dictionary generating method, the fault dictionary generating method comprising:
   simulating one or more faults in a representation of the electronic circuit as one or more test patterns are applied to the representation;
   selecting one or more failing test patterns from the simulation results;
   identifying one or more unique failing bit combinations for the selected failing patterns;
   creating one or more signatures from the one or more unique failing bit combinations; and
   storing the one or more signatures on the one or more non-transitory computer-readable storage media.

14. One or more non-transitory computer-readable storage media containing a fault dictionary made according to the fault dictionary generating method of claim 13.

15. The method of claim 1, wherein the determining the set of one or more fault candidates further comprises generating a compressed signature for at least one pattern in the set of failing test patterns.

16. The method of claim 1, wherein the fault dictionary describes only a portion of possible circuit outputs for one or more of the modeled faults for the failing test patterns.

17. One or more non-transitory computer-readable storage media encoded with instructions which, when executed by a computer, implement a method of diagnosing defects in an electronic circuit, the method comprising:

determining a set of one or more fault candidates for the electronic circuit for a set of failing test patterns by using a fault dictionary that describes responses of one or more modeled faults to the failing test patterns;

after determining the set of one or more fault candidates, simulating one or more fault candidates of the determined set using both failing and passing test patterns, wherein only a subset of the total passing test patterns is used during the simulating; and storing the one or more fault candidates and results of the simulating.

18. The one or more non-transitory computer-readable storage media of claim 17, wherein the fault dictionary comprises a description of one or more failing test patterns having more than a threshold number of failing bits, wherein the threshold number is greater than one.

19. The one or more non-transitory computer-readable storage media of claim 17, wherein the one or more fault candidates of the determined set are simulated using at least one passing pattern, the method further comprising:

selecting one or more passing test patterns for simulation with one or more of the fault candidates of the electronic circuit, wherein the one or more passing test patterns are selected based at least in part on associations of the one or more passing test patterns with one or more clocks associated with the one or more fault candidates; and storing the selection.

20. The one or more non-transitory computer-readable storage media of claim 19, the method further comprising determining the associations of the one or more passing test patterns with the one or more clocks based at least in part on a netlist description of the electronic circuit.

21. The one or more non-transitory computer-readable storage media of claim 19, wherein the associations indicate which of the one or more clocks clock scan cells that capture failing bits caused by the one or more fault candidates.

22. The one or more non-transitory computer-readable storage media of claim 19, wherein an association of a respective one of the one or more clocks with the one or more fault candidates is indicated by a single bit.

23. The one or more non-transitory computer-readable storage media of claim 17, the method further comprising:

ranking the one or more fault candidates based at least in part on results of the simulation; and storing the results of the ranking.

24. The one or more non-transitory computer-readable storage media of claim 17, wherein the fault dictionary comprises one or more entries identifying one or more fault candidates and identifying one or more clocks that are associated with scan cells that capture failing bits caused by the one or more fault candidates.

25. The one or more non-transitory computer-readable storage media of claim 17, wherein the fault dictionary comprises information associating one or more circuit clock signals with the one or more fault candidates.

26. The one or more non-transitory computer-readable storage media of claim 17, wherein the fault dictionary comprises one or more entries indicating possible signatures produced by one or more of the failing test patterns.

27. The one or more computer-readable storage media of claim 17, wherein the fault dictionary that describes responses of the one or more modeled faults to the failing test patterns is generated according to a fault dictionary generating method, the fault dictionary generating method comprising:

for a selected fault, simulating one or more test patterns being applied to the electronic circuit in the presence of the selected fault;

determining test responses to the one or more test patterns that indicate the presence of the selected fault using the simulation; and storing a fault dictionary entry that identifies the selected fault and identifies the test responses that indicate the presence of the selected fault.

28. The one or more non-transitory computer-readable storage media of claim 27, wherein the fault dictionary entry is the only entry in the fault dictionary for the selected fault.

29. The one or more non-transitory computer-readable storage media of claim 27, wherein the fault dictionary entry does not indicate which of the one or more test patterns caused the test responses that indicate the presence of the selected fault to be produced.

30. The one or more non-transitory computer-readable storage media of claim 27, wherein the fault dictionary generating method further comprises repeating the acts of simulating, determining, and storing for multiple additional faults.

31. The one or more non-transitory computer-readable storage media of claim 27, wherein the determining the test responses comprises generating x-bit signatures from full test responses of the electronic circuit to the one or more test patterns.

32. The one or more non-transitory computer-readable storage media of claim 31, wherein the storing the fault dictionary entry comprises storing the corresponding x-bit signatures as the test responses that indicate the presence of the selected fault.

33. The one or more non-transitory computer-readable storage media of claim 32, wherein the x-bit signatures are generated by a simulated multiple-input signature register (MISR).

34. The one or more non-transitory computer-readable storage media of claim 32, wherein the fault dictionary generating method further comprises storing information indicative of which clocks clocked scan cells that captured failing bits indicative of the presence of the selected fault during the simulation.

35. The one or more non-transitory computer-readable storage media of claim 17, wherein the fault dictionary that describes responses of the one or more modeled faults to the failing test patterns is generated according to a fault dictionary generating method, the fault dictionary generating method comprising:

determining, for a selected fault, that a first test pattern and a second test pattern detect the selected fault and produce a same respective signature; and storing one fault dictionary entry for the first and second failing test patterns.

36. The one or more non-transitory computer-readable storage media of claim 17, wherein the fault dictionary that describes responses of the one or more modeled faults to the failing test patterns is generated according to a fault dictionary generating method, the fault dictionary generating method comprising:

simulating one or more faults in a representation of the electronic circuit as one or more test patterns are applied to the representation;

selecting one or more failing test patterns from the simulation results;

identifying one or more unique failing bit combinations for the selected failing patterns;

creating one or more signatures from the one or more unique failing bit combinations; and storing the one or more signatures.

37. The one or more non-transitory computer-readable storage media of claim 36, wherein the selecting one or more failing test patterns from the simulation results comprises selecting failing test patterns whose simulated results produce fewer than a threshold number of failing bits.

38. The one or more non-transitory computer-readable storage media of claim 36, wherein the fault dictionary generating method is part of a preprocessing phase of an electronic circuit testing method.

39. The one or more non-transitory computer-readable storage media of claim 36, wherein the storing the one or more signatures comprises associating a given signature with a group of two or more faults.

40. The one or more non-transitory computer-readable storage media of claim 36, wherein the group of two or more faults is located in a fan-out free region.

41. A computer comprising:
a processor; and
one or more non-transitory computer-readable storage media encoded with instructions configured to cause the processor to:
   determine a set of one or more fault candidates for an electronic circuit for a set of failing test patterns by using a fault dictionary that describes responses of one or more modeled faults to the failing test patterns;
   simulate one or more fault candidates of the previously determined set using both failing test patterns and a subset of the total passing test patterns; and
   store the one or more fault candidates and results of the simulating.

42. The computer of claim 41, the method further comprising:
ranking the one or more fault candidates based at least in part on results of the simulation; and
storing the results of the ranking on the one or more non-transitory computer-readable storage media.

43. The computer of claim 41, wherein the fault dictionary comprises one or more entries identifying one or more fault candidates and identifying one or more clocks that are associated with scan cells that capture failing bits caused by the one or more fault candidates.

44. The computer of claim 41, wherein the fault dictionary comprises information associating one or more circuit clock signals with the one or more fault candidates.

45. The computer of claim 41, wherein the fault dictionary comprises one or more entries indicating possible signatures produced by one or more of the failing test patterns.

46. The computer of claim 41, wherein the fault dictionary that describes responses of the one or more modeled faults to the failing test patterns is generated according to a fault dictionary generating method, the fault dictionary generating method comprising:
for a selected fault,
   simulating one or more test patterns being applied to the electronic circuit in the presence of the selected fault;
   determining test responses to the one or more test patterns that indicate the presence of the selected fault using the simulation; and
   storing a fault dictionary entry that identifies the selected fault and identifies the test responses that indicate the presence of the selected fault.

47. The computer of claim 41, wherein the fault dictionary that describes responses of the one or more modeled faults to the failing test patterns is generated according to a fault dictionary generating method, the fault dictionary generating method comprising:
determining, for a selected fault, that a first test pattern and a second test pattern detect the selected fault and produce a same respective signature; and
storing one fault dictionary entry for the first and second failing test patterns.

48. The computer of claim 41, wherein the fault dictionary that describes responses of the one or more modeled faults to the failing test patterns is generated according to a fault dictionary generating method, the fault dictionary generating method comprising:
simulating one or more faults in a representation of the electronic circuit as one or more test patterns are applied to the representation;
selecting one or more failing test patterns from the simulation results;
identifying one or more unique failing bit combinations for the selected failing patterns;
creating one or more signatures from the one or more unique failing bit combinations; and
storing the one or more signatures.

* * * * *